(12) United States Patent
Hartig

(10) Patent No.: US 10,790,127 B2
(45) Date of Patent: *Sep. 29, 2020

(54) FLEXIBLE ADJUSTABLE RETURN PATH MAGNET ASSEMBLY AND METHODS

(71) Applicant: Cardinal CG Company, Eden Prairie, MN (US)

(72) Inventor: Klaus H. W. Hartig, Avoca, WI (US)

(73) Assignee: CARDINAL CG COMPANY, Eden Prairie, MN (US)

(*) Notice: Subject to any disclaimer, the term of this patent is extended or adjusted under 35 U.S.C. 154(b) by 278 days.

This patent is subject to a terminal disclaimer.

(21) Appl. No.: 15/969,919

(22) Filed: May 3, 2018

(65) Prior Publication Data

US 2018/0323048 A1 Nov. 8, 2018

Related U.S. Application Data

(60) Provisional application No. 62/501,277, filed on May 4, 2017.

(51) Int. Cl.
*H01J 37/34* (2006.01)
*C23C 14/35* (2006.01)

(52) U.S. Cl.
CPC .......... *H01J 37/3455* (2013.01); *C23C 14/35* (2013.01); *H01J 37/34* (2013.01); *H01J 37/345* (2013.01); *H01J 37/3408* (2013.01); *H01J 37/3461* (2013.01)

(58) Field of Classification Search
CPC ... H01J 37/3461; H01J 37/345; H01J 37/3408
USPC ..................................... 204/298.19
See application file for complete search history.

(56) References Cited

U.S. PATENT DOCUMENTS

| | | |
|---|---|---|
| 4,309,266 A | 1/1982 | Nakamura et al. |
| 4,734,183 A | 3/1988 | Wirz et al. |
| 4,964,968 A | 10/1990 | Arita |
| 5,399,253 A | 3/1995 | Gruenenfelder |
| 5,415,754 A | 5/1995 | Manley |
| 5,685,959 A | 11/1997 | Bourez et al. |
| 6,299,740 B1 | 10/2001 | Hieronymi et al. |
| 6,372,098 B1 | 4/2002 | Newcomb et al. |
| 6,395,146 B2 | 5/2002 | Hieronymi et al. |
| 6,416,639 B1 | 7/2002 | De Bosscher et al. |
| 6,821,397 B2 | 11/2004 | Krassnitzer |

(Continued)

FOREIGN PATENT DOCUMENTS

| | | |
|---|---|---|
| DE | 10010448 C1 | 4/2002 |
| DE | 10234858 A1 | 2/2004 |

(Continued)

OTHER PUBLICATIONS

International Patent Application No. PCT/US2017/034197, International Search Report and Written Opinion dated Aug. 21, 2017, 14 pages.

(Continued)

*Primary Examiner* — John J Brayton
(74) *Attorney, Agent, or Firm* — Fredrikson & Byron, P.A.

(57) ABSTRACT

The invention provides a sputter deposition assembly that includes a sputtering chamber, a sputtering target, and a magnet assembly. The magnet assembly includes a magnetic backing plate comprising an elongated flexible magnetic control body or a plurality of layered metal sheets.

21 Claims, 11 Drawing Sheets

(56) References Cited

U.S. PATENT DOCUMENTS

| | | | |
|---|---|---|---|
| 7,347,919 | B2 | 3/2008 | Sato et al. |
| 7,368,041 | B2 | 5/2008 | Krassnitzer |
| 7,678,240 | B2 | 3/2010 | Krassnitzer |
| 8,273,221 | B2 | 9/2012 | Schneider et al. |
| 8,685,214 | B1 | 4/2014 | Moh et al. |
| 8,951,394 | B2 | 2/2015 | Bernick et al. |
| 10,151,023 | B2 * | 12/2018 | Hartig ............... C23C 14/3407 |
| 2006/0065525 | A1 | 3/2006 | Weichart |
| 2009/0200158 | A1 | 8/2009 | Ehiasarian |
| 2009/0205949 | A1 | 8/2009 | Zueger |
| 2009/0229970 | A1 | 9/2009 | Itagaki et al. |
| 2009/0229977 | A1 | 9/2009 | Kondo et al. |
| 2009/0242396 | A1 | 10/2009 | Brcka et al. |
| 2009/0277779 | A1 | 11/2009 | Sasaki |
| 2010/0006424 | A1 | 1/2010 | Chung et al. |
| 2011/0079509 | A1 | 4/2011 | Morohashi |
| 2013/0180851 | A1 | 7/2013 | Kong et al. |
| 2013/0299349 | A1 | 11/2013 | Kuriyama et al. |
| 2014/0054168 | A1 | 2/2014 | German et al. |
| 2014/0158523 | A1 | 6/2014 | Newcomb |
| 2015/0075970 | A1 | 3/2015 | Miller |
| 2015/0194294 | A1 | 7/2015 | Bernick et al. |
| 2017/0369985 | A1 | 12/2017 | Hartig |
| 2017/0372880 | A1 | 12/2017 | Hartig |

FOREIGN PATENT DOCUMENTS

| | | | |
|---|---|---|---|
| EP | 2009670 A1 | 12/2008 | |
| EP | 2669403 A1 | 12/2013 | |
| JP | 2907620 B2 | 6/1999 | |
| JP | 2012077360 A | 4/2012 | |

OTHER PUBLICATIONS

International Patent Application No. PCT/US2017/034190, International Search Report and Written Opinion dated Aug. 25, 2017, 12 pages.

International Patent Application No. PCT/US2018/030778, International Search Report and Written Opinion dated Aug. 3, 2018, 12 pages.

U.S. Appl. No. 15/193,484, Non-Final Office Action dated Dec. 27, 2017, 16 pages.

U.S. Appl. No. 15/193,484, Amendment and Response to Non-Final Office Action filed Mar. 27, 2018, 18 pages.

U.S. Appl. No. 15/193,484, Applicant Initiated Interview Summary dated Mar. 28, 2018, 3 pages.

U.S. Appl. No. 15/193,484, Applicant Summary of Interview with Examiner filed Mar. 27, 2018, 3 pages.

U.S. Appl. No. 15/193,484, Notice of Allowance dated May 10, 2018, 10 pages.

U.S. Appl. No. 15/193,507, Non-Final Office Action dated Dec. 8, 2017, 10 pages.

U.S. Appl. No. 15/193,507, Amendment and Response to Non-Final Office Action filed Mar. 7, 2018, 15 pages.

U.S. Appl. No. 15/193,507, Final Office Action dated Apr. 27, 2018, 6 pages.

U.S. Appl. No. 15/193,507, Response to Final Office Action filed Jun. 27, 2018, 5 pages.

U.S. Appl. No. 15/193,507, Applicant Summary of Interview with Examiner filed Jun. 27, 2018, 2 pages.

U.S. Appl. No. 15/193,507, Notice of Allowance dated Aug. 6, 2018, 8 pages.

U.S. Appl. No. 15/193,507, Comments on Statement of Reasons for Allowance filed Nov. 5, 2018, 2 pages.

* cited by examiner

*Fig. 5*
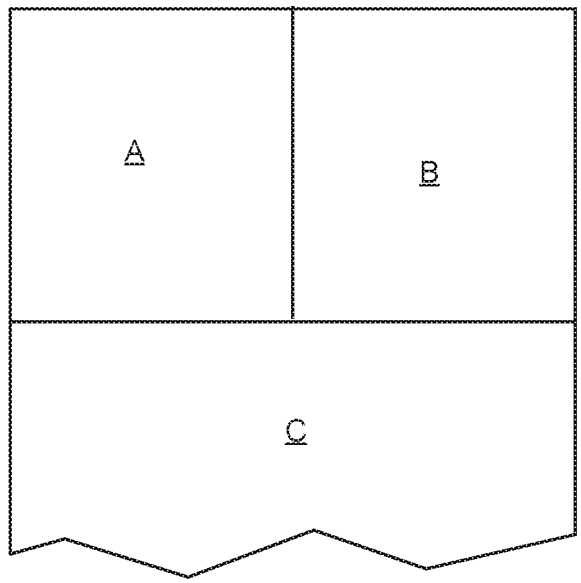
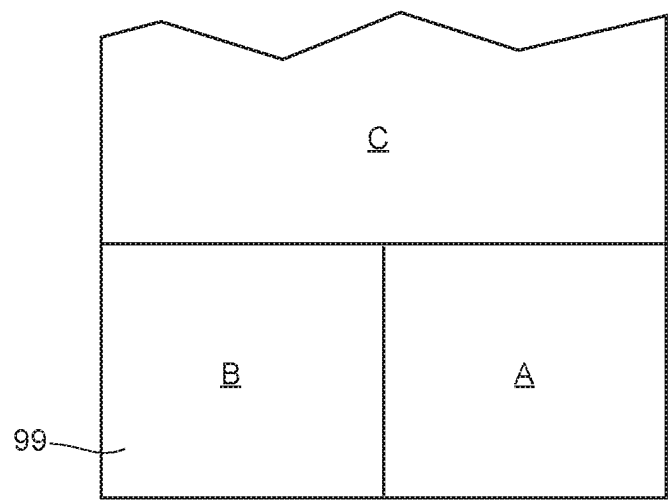

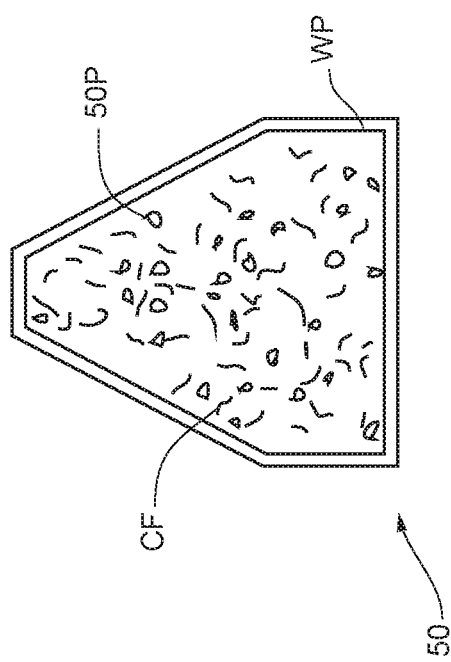

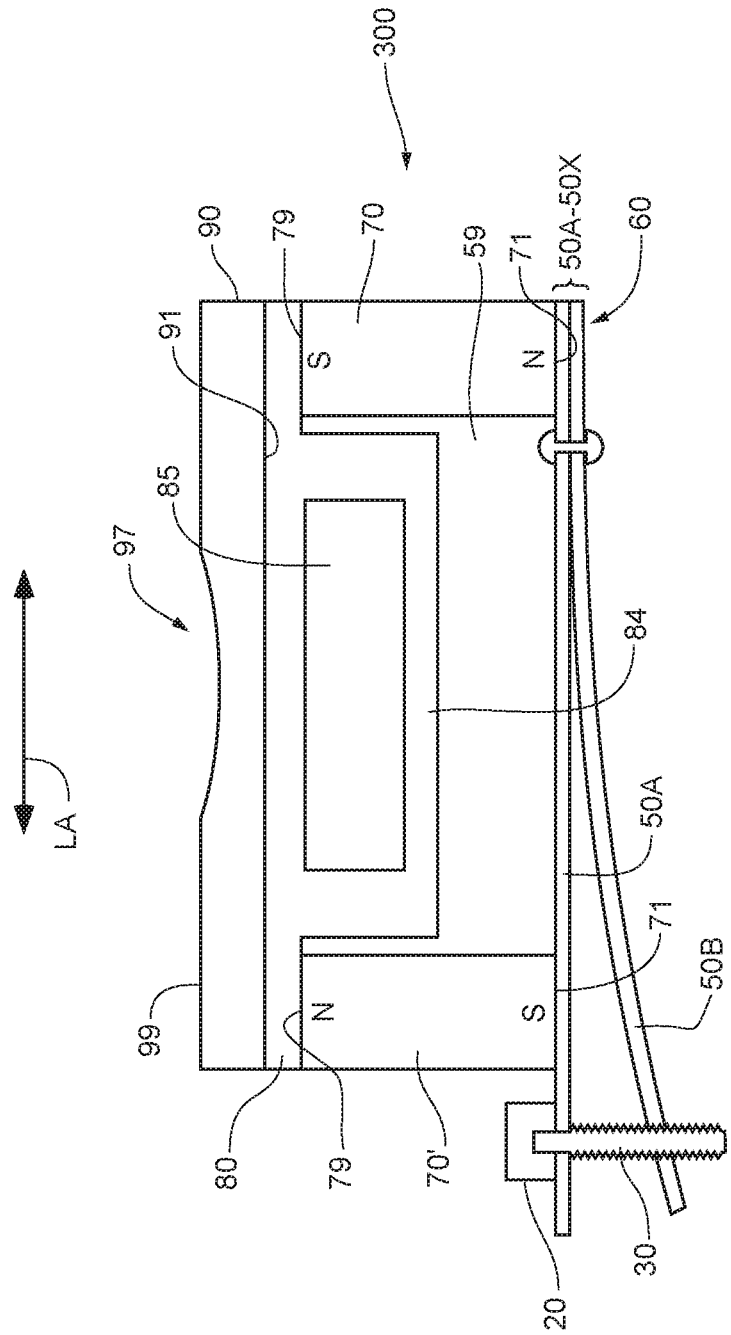

US 10,790,127 B2

FLEXIBLE ADJUSTABLE RETURN PATH MAGNET ASSEMBLY AND METHODS

RELATED APPLICATIONS

This application claims priority to U.S. Provisional Application No. 62/501,277, filed May 4, 2017, the contents of which are incorporated by reference herein.

FIELD OF THE INVENTION

The present invention relates to methods and equipment for depositing thin film coatings onto glass and other substrates. In particular, this invention relates to methods and equipment for sputter depositing such coatings.

BACKGROUND OF THE INVENTION

Glass sheets and other substrates can be coated with many different thin film materials. Sputter deposition (or "sputtering") is one method of depositing such coatings. Sputtering is advantageous in that it can deposit a wide variety of different film materials at well controlled, relatively uniform thicknesses. Film uniformity, however, is sometimes adversely impacted by the limitations of conventional sputter deposition equipment and process control. For example, various process phenomena, such as the so-called "cross-corner effect," can negatively impact film uniformity. Also, over the course of a production run, process conditions can change (or "drift"), causing uniformity problems. More generally, with conventional hardware and process control, the deposition rate can vary significantly at different points on the substrate due to local process conditions differing at various points on the sputtering target.

It would be desirable to provide sputter deposition equipment that is locally adjustable so as to compensate for differences in local process conditions across a sputtering target. It would be particularly desirable to provide equipment of this nature that is locally adjustable without having to move an entire magnet assembly relative to the sputtering target. Further, it would be desirable to provide sputter deposition methods wherein process conditions are adjusted locally. It would be particularly desirable to provide methods of this nature that involve adjusting the process conditions locally without locally moving an entire magnet assembly relative to the sputtering target.

BRIEF DESCRIPTION OF THE DRAWINGS

FIG. 5 is a schematic front view of various zones of the planar sputtering target of FIG. 5.

FIG. 10 is a schematic cross-sectional view of a flexible magnetic control body for use in an adjustable magnet assembly in accordance with certain embodiments of the invention.

FIG. 11 is a schematic cross-sectional end view of a sputter deposition assembly including a planar sputtering target and an adjustable return path magnet assembly in accordance with another embodiment of the present invention, wherein the adjustable return path magnet assembly includes a magnetic backing plate comprising a plurality of layered metal sheets.

SUMMARY

Figure 1:
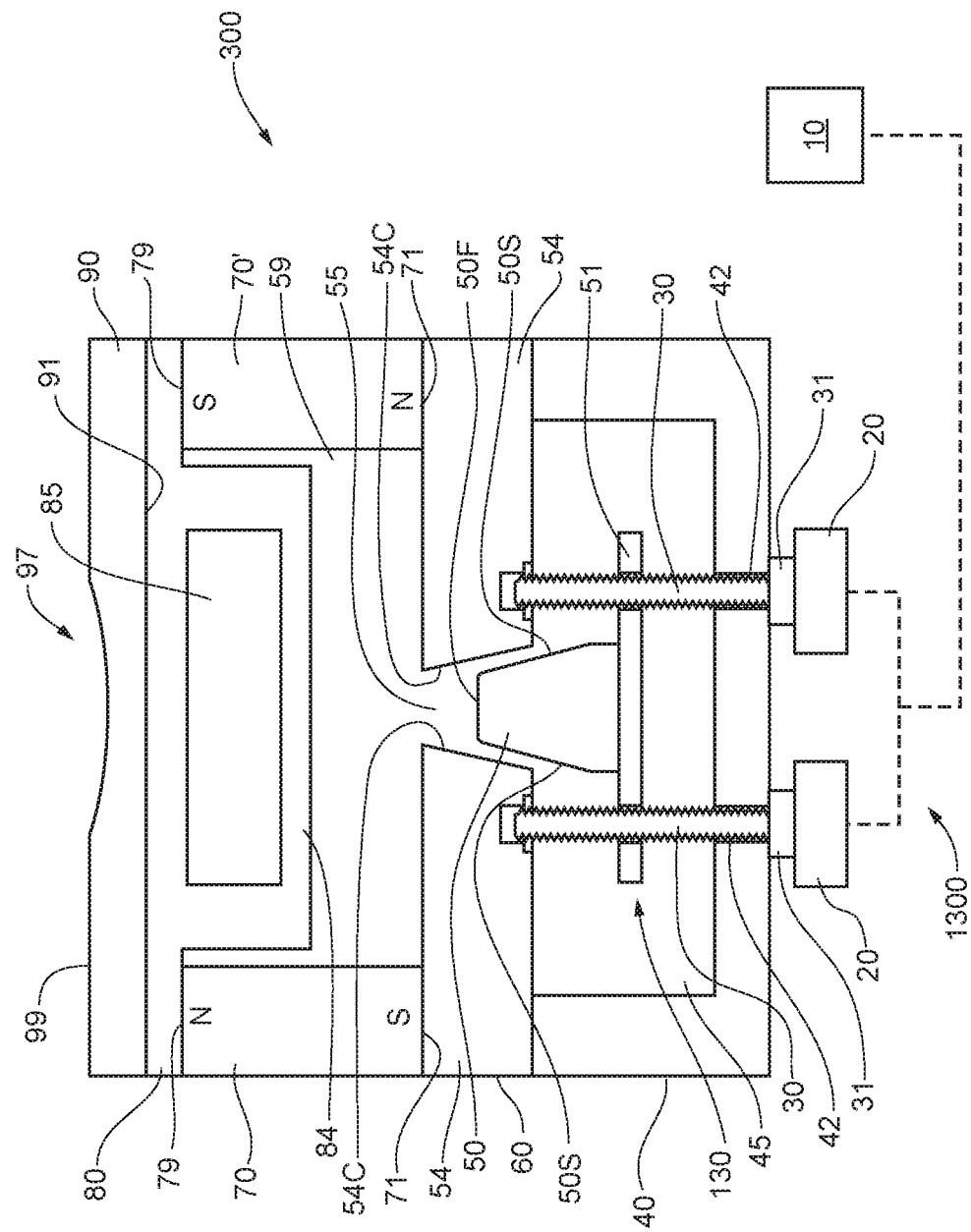
FIG. 1 is a schematic cross-sectional end view of a sputter deposition assembly including a planar sputtering target and an adjustable return path magnet assembly in accordance with one embodiment of the present invention, wherein a flexible magnetic control body of the magnet assembly is shown in one position.

In some embodiments, the invention provides a sputter deposition assembly comprising a sputtering chamber, a sputtering target, and a magnet assembly. The magnet assembly is mounted adjacent to a rear surface of the sputtering target. The magnet assembly includes a magnetic backing plate and spaced-apart first and second permanent magnets. The first and second permanent magnets each have a proximal end and a distal end. The distal end is further from the sputtering target than is the proximal end. The magnet assembly creates a magnetic field comprising field lines that extend from the proximal end of the first magnet, through the sputtering target, along an arc located in front of the sputtering target, back through the sputtering target, to the proximal end of the second permanent magnet, through the second permanent magnet, along a return path, and to the distal end of the first permanent magnet. The return path passes through the magnetic backing plate of the magnet assembly. The magnetic backing plate defines a gap. The magnet assembly further includes an elongated flexible magnetic control body mounted so as to project into the gap. The elongated flexible magnetic body has a length and is differentially bendable along the length so as to project further into the gap at one position along the length than at another position along the length.

Other embodiments of the invention provide a sputter deposition assembly comprising a sputtering chamber, a sputtering target, and a magnet assembly. The magnet assembly is mounted adjacent to a rear surface of the sputtering target. The magnet assembly includes a magnetic backing plate and spaced-apart first and second permanent magnets. The first and second permanent magnets each have a proximal end and a distal end. The distal end is further from the sputtering target than is the proximal end. The magnet assembly creates a magnetic field comprising field lines that extend from the proximal end of the first magnet, through the sputtering target, along an arc located in front of the sputtering target, back through the sputtering target, to the proximal end of the second permanent magnet, through the second permanent magnet, along a return path, and to the distal end of the first permanent magnet. The return path passes through the magnetic backing plate of the magnet assembly. The magnetic backing plate comprises a plurality of layered metal sheets, each formed of ferromagnetic or ferrimagnetic material.

DETAILED DESCRIPTION

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The present invention provides an adjustable sputter deposition system. The system offers exceptional performance in terms of its ability to achieve uniform film deposition in a wide variety of sputter deposition processes. For example, by providing an adjustable return path magnet assembly, it is possible to compensate for various process phenomena that may otherwise negatively impact the uniformity of the resulting film. In addition, the adjustability of the present magnet assembly can be used to address various process drift situations. Preferably, the system can be adjusted locally without needing to move the primary magnets of the magnet assembly (or the entire magnet assembly) closer to or further from the sputtering target.

Figure 4:
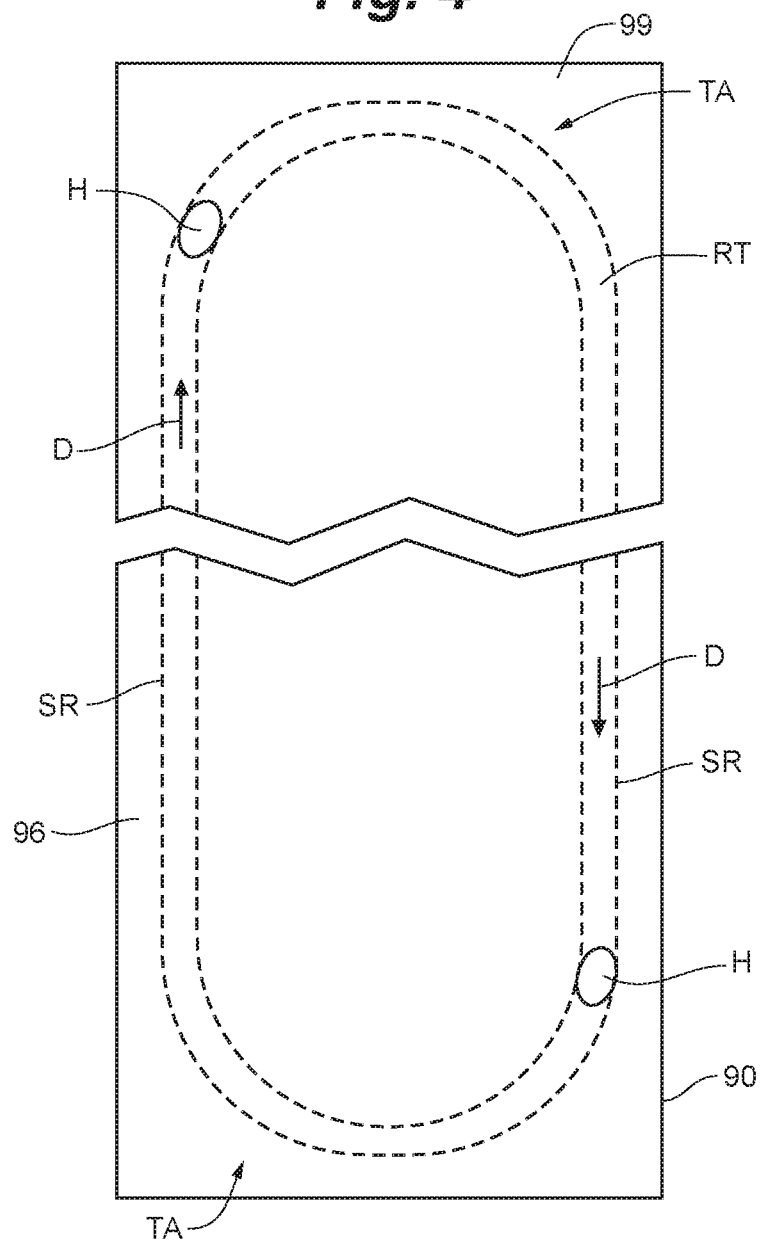
FIG. 4 is a schematic front view of a sputter deposition assembly that includes a planar sputtering target and an adjustable magnet assembly in accordance with certain embodiments of the invention.

The invention provides a sputter deposition assembly 100 that includes a sputtering chamber 200, a sputtering target 90, and a magnet assembly 300. The magnet assembly 300 is mounted adjacent to a rear surface 91 of the target 90. The magnet assembly 300 includes a plurality of primary magnets 70, 70' that generate a magnetic field (e.g., a magnetron magnetic field) 150. Preferably, the magnet assembly 300 is configured in a racetrack arrangement RT that includes: (i) two generally parallel elongated side regions SR, and (ii) two curved turnaround regions TA at opposite ends of the racetrack arrangement. Reference is made to FIG. 4.

The magnet assembly 300 includes a magnetic backing plate 60 and laterally spaced-apart first and second permanent magnets 70, 70'. The first and second permanent magnets 70, 70' each have a proximal end 79 and a distal end 71. The distal end 71 is further from the adjacent rear surface 91 of the sputtering target 90 than is the proximal end 79. The magnet assembly 300 creates a magnetic field 150 comprising field lines 155 that extend from the proximal end 79 of the first magnet 70, through the sputtering target 90, along an arc located in front of the sputtering target, back through the sputtering target, to the proximal end 79 of the second permanent magnet 70', through the second permanent magnet, along a return path, and to the distal end 71 of the first permanent magnet 70. This is best appreciated by referring to FIG. 6. The return path passes through the magnetic backing plate 60 of the magnet assembly 300.

In a first group of embodiments, the magnetic backing plate 60 has (e.g., bounds or defines) a gap 55. Reference is made to FIGS. 1-3 and 6-9. Here, the magnetic backing plate 60 comprises two plate segments 54 having confronting ends 54C that bound the gap 55. These two plate segments 54 preferably are plate-shaped walls formed of ferromagnetic or ferrimagnetic material. The illustrated plate-shaped walls 54 extend between the first 70 and second 70' permanent magnets and define the gap 55. Preferably, the two plate segments 54 are mounted respectively against and/or adjacent to (optionally directly against, i.e., so as to contact) the distal ends 71 of the two permanent magnets 70, 70'. In FIGS. 1-3 and 6-9, the two plate segments 54 are parallel (or at least generally parallel) to the adjacent rear surface 91 of the target 90.

The confronting ends 54C of the illustrated plate segments 54 are angled so as to converge with increasing proximity to the sputtering target 90. They may alternatively have various curved converging configurations. Such arrangements advantageously provide the gap 55 with a tapered configuration wherein the narrower end of the gap is closer to the sputtering target 90 than is the wider end of the gap. This, however, is not required. For example, the confronting ends of the plate segments can alternatively be parallel to each other, such that the gap has a rectangular configuration. If desired, the confronting ends of the plate segments can be curved such that the gap has a semicircular or other curved tapered configuration. It is to be appreciated that many variants of this nature can be used. Certain advantages are achieved by providing the gap with a tapered configuration wherein the narrower end of the gap is closer to the sputtering target than is the wider end of the gap. For example, this can effectively define a stop for forward movement (e.g., a forward adjustment limit) of a moveable magnetic control body.

In FIGS. 1-3 and 6-9, the gap 55 opens entirely through the magnetic backing plate 60. The gap 55, however, can alternatively be a blind channel defined by the magnetic backing plate. Such embodiments are also advantageous in that the blind bottom of the gap can define a stop for forward movement of a moveable magnetic control body, which will now be described.

In the embodiments of FIGS. 1-3 and 6-9, the magnet assembly 300 includes an elongated flexible magnetic control body 50 mounted so as to project into the gap 55. This is perhaps best appreciated by referring to FIGS. 1 and 2. The elongated flexible magnetic control body 50 has a length and is differentially deformable (e.g., bendable) along the length so as to project further into the gap 55 at one position (or at a plurality of first positions) along the length than at another position (or at a plurality of second positions) along the length.

The sputter deposition assembly 100 is configured such that the magnetic field 150 (e.g., an arc of magnetic field lines 155 thereof and/or a region thereof) located in front of the sputtering target 90 changes in strength, configuration, or both in response to deformation (e.g., bending) of the elongated flexible magnetic control body 50 so as to project to a greater or less extent into the gap 55 at one or more desired positions along its length.

Figure 3:
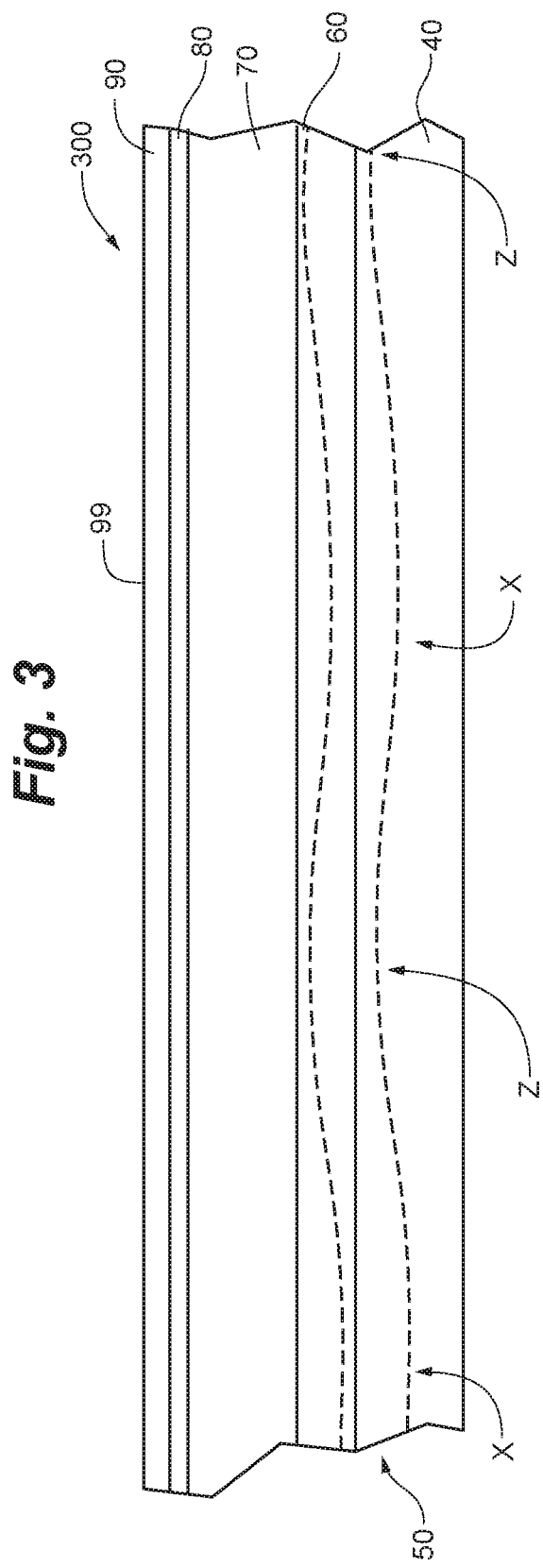
FIG. 3 is a schematic cross-sectional side view of a sputter deposition assembly including a planar sputtering target and an adjustable return path magnet assembly in accordance with certain embodiments of the invention, wherein a flexible magnetic control body has been bent such that along certain sections of its length it is closer to the sputtering target than it is along certain other sections of its length.

The bendable or otherwise deformable nature of the elongated flexible magnetic control body 50 is perhaps best appreciated by referring to FIG. 3. Here, it can be seen that the elongated flexible magnetic control body 50 can be (and in FIG. 3, has been) bent or otherwise deformed locally so as to project further into the gap 55 at one or more positions along the length of the elongated flexible magnetic control body 50 than at one or more other positions along the length. In FIG. 3, for example, the elongated flexible magnetic control body 50 is bent such that it is closer to the rear surface 91 of the sputtering target 90 at two or more first positions Z along its length than it is at two or more second positions X along its length. It is to be understood that the particular shape into which the elongated flexible magnetic control body 50 has been bent in FIG. 3 is by no means limiting. To the contrary, for any given sputtering process (or any given stage of such a process), the operator may wish to bend or otherwise deform the elongated flexible magnetic control body 50 into any of a variety of different configurations. Skilled artisans will appreciate that different processes, or different stages of a given process, may benefit from bending or otherwise deforming the elongated flexible magnetic control body 50 into different configurations. For example, a configuration that improves uniformity for one process may be different from the configuration(s) that improve uniformity for another process. In this regard, it is to be appreciated that the elongated flexible magnetic control body 50 has a construction that enables it to be bent or otherwise deformed, repeatedly, into different configurations.

The elongated flexible magnetic control body 50 preferably is constructed to be bendable (and to bend) differentially along its length so as to define a continuous profile devoid of step-like transitions along the length of the elongated flexible magnetic control body. This can be appreciated by referring to FIG. 3. Here, it can be appreciated that the elongated flexible magnetic control body 50 preferably can be bent or otherwise deformed so as to have a serpentine configuration. In FIGS. 1-3 and 6-9, the elongated flexible magnetic control body 50 has an elongated bar-like configuration.

The illustrated elongated flexible magnetic control body 50 has a plug-like configuration, with a relatively narrow width and tapered sides. It is to be appreciated, however, that the shape can be varied as desired. For example, the elongated flexible magnetic control body 50 can be wider. And rather than having tapered sides, its sides may be parallel to each other. Another possibility is for the elongated flexible magnetic control body 50 to be circular, semicircular, or oval in cross section. For example, the elongated flexible magnetic control body 50 can have a rope-like configuration.

Thus, the elongated flexible magnetic control body 50 is differentially bendable or otherwise deformable, preferably such that an extent to which it projects into the gap 55 at a given section or point (e.g., at any section or point) along its length is locally adjustable between first and second configurations. When a given section or point of the elongated flexible magnetic control body 50 is in the first position, that section is disposed further into the gap 55 than it is when in the second position. In more detail, the elongated flexible magnetic control body 50 preferably is movable (e.g., by being bent or otherwise deformed) toward and away from the sputtering target 90. In such cases, a given section or point of the elongated flexible magnetic control body 50 moves away from the sputtering target 90 in moving from its first position toward its second position, whereas a given section or point of the elongated flexible magnetic control body moves toward the sputtering target in moving from its second position toward its first position. This can be appreciated by comparing FIGS. 1 and 2. FIG. 2 depicts the elongated flexible magnetic control body 50 in the first position, and FIG. 1 depicts the elongated flexible magnetic control body in the second position.

Figure 6:
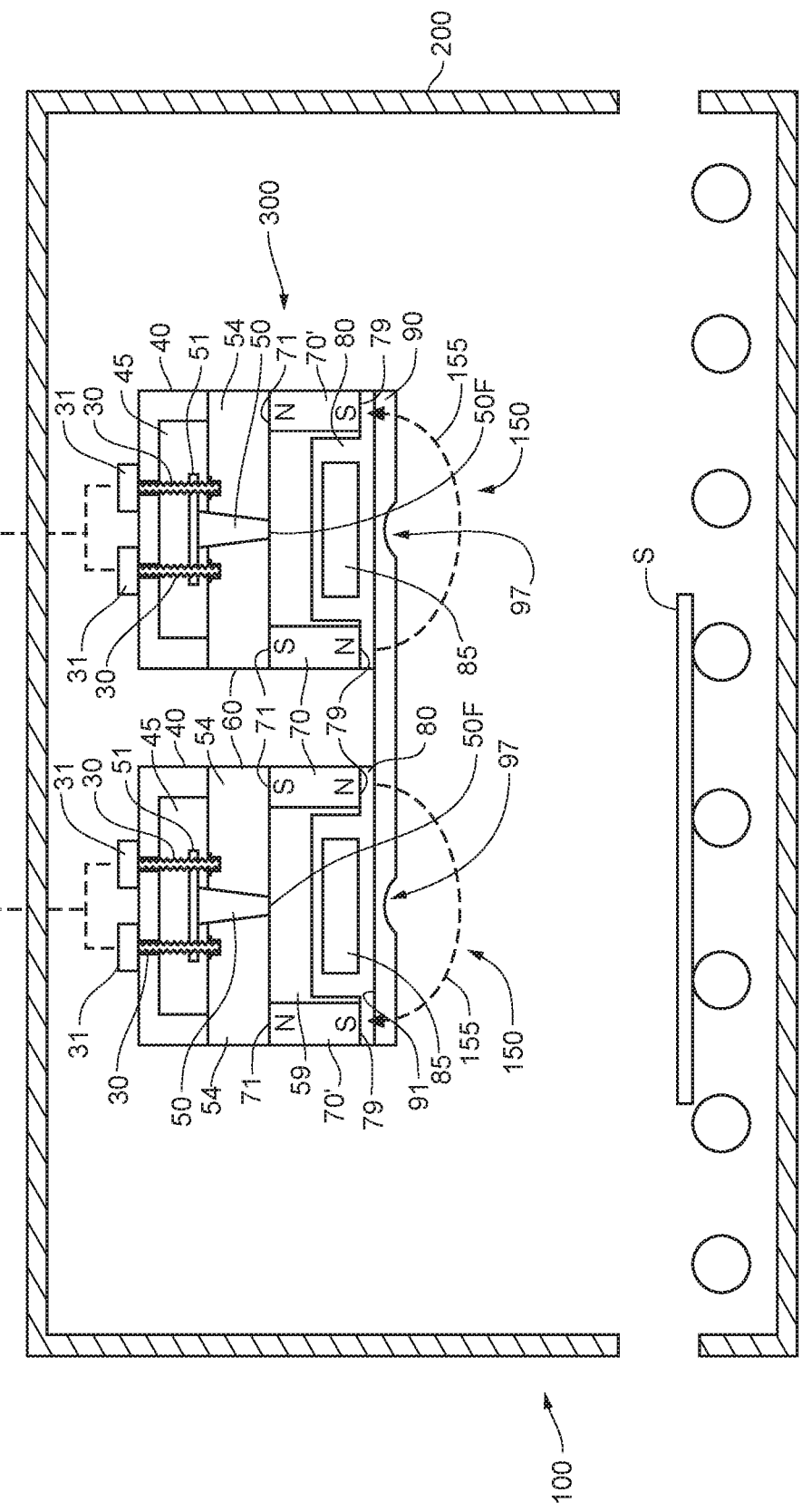
FIG. 6 is a schematic cross-sectional end view of a sputter deposition assembly including a sputtering chamber, a sputtering target, and an adjustable magnet assembly in accordance with certain embodiments of the invention.

Movement of a given section or point of the elongated flexible magnetic control body 50 toward the sputtering target 90 may involve that section or point of the elongated flexible magnetic control body moving toward the path of substrate travel (see FIG. 6). Conversely, movement of a given section or point of the elongated flexible magnetic control body 50 away from the sputtering target 90 may involve that section or point of the elongated flexible magnetic control body moving away from the path of substrate travel. In the embodiment of FIG. 6, the sputtering chamber 200 is configured for sputter-down processes. It is to be appreciated, however, that the sputtering chamber can alternatively be configured for sputter-up processes or sideways sputtering.

The sputter deposition assembly 100 is configured such that the magnetic field 150 (e.g., an arc of magnetic field lines 155 thereof and/or a region thereof) located in front of the sputtering target 90 changes in strength, configuration, or both in response to adjustment (e.g., by bending or other deformation) of the elongated flexible magnetic control body 50 involving movement of one or more sections or points thereof between the first and second positions (such movement being toward or away from the sputtering target 90). Thus, it is possible to adjust the magnetic field 150 in front of the sputtering target 90 without having to physically move the permanent magnets 70, 70' (or the whole magnet assembly 300) closer to or further from the adjacent rear surface 91 of the target. This makes it possible to avoid large, complicated, and/or less reliable systems that may otherwise be required to move the permanent magnets 70, 70' (or the whole magnet assembly 300) toward or away from the adjacent rear surface of the target.

Figure 2:
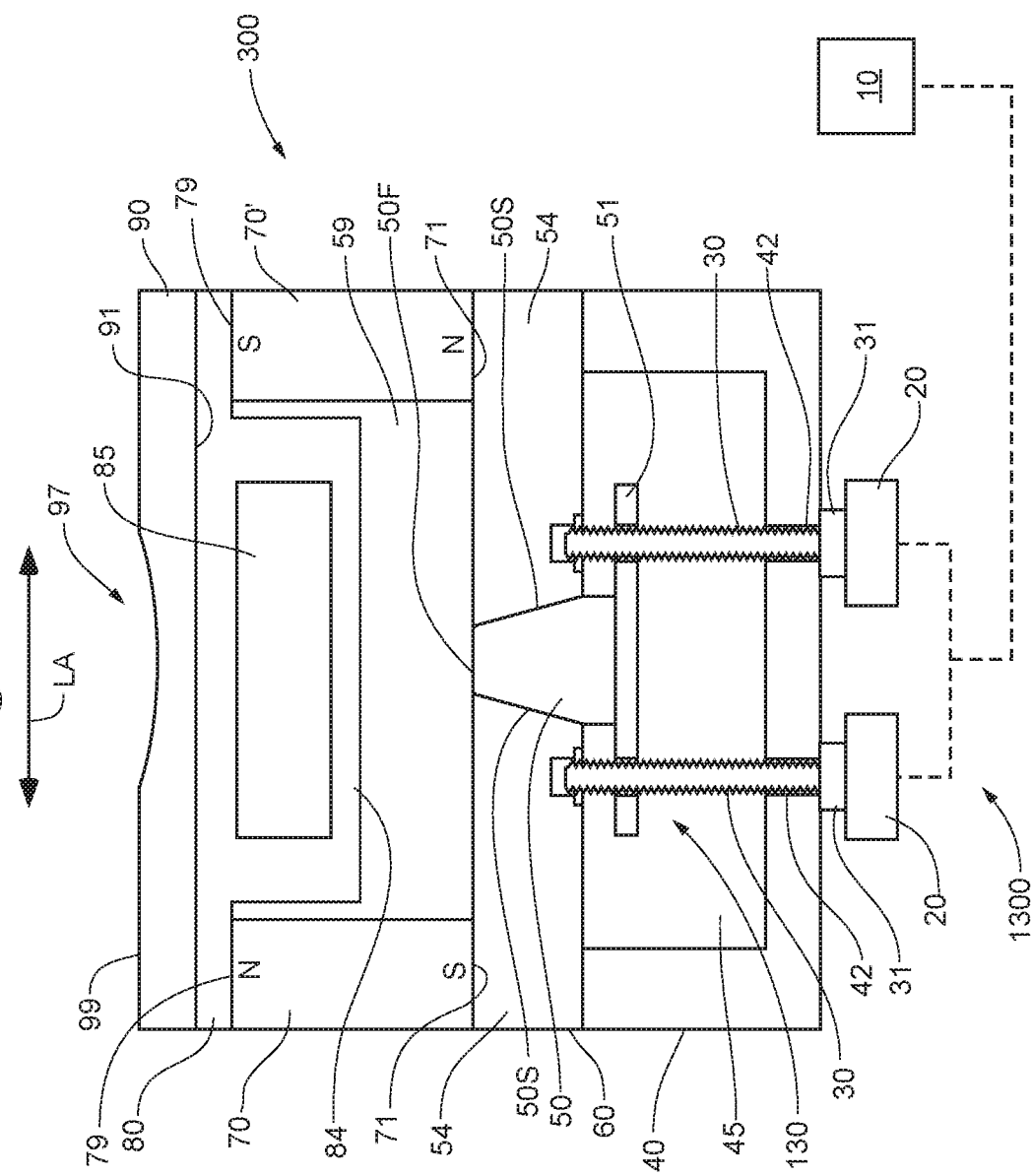
FIG. 2 is a schematic cross-sectional end view of the sputter deposition assembly of FIG. 1, wherein the flexible magnetic control body of the magnet assembly is shown in another position.

As shown in FIGS. 1 and 2, in some embodiments, when a given section or point of the elongated flexible magnetic control body 50 is in the first position, it is bottomed-out in the gap 55 of the magnetic backing plate 60, and when in the second position is spaced apart from the confronting ends 54c of the plate segments 54. As a result, the magnetic backing plate 60 provides (e.g., forms) a lower resistance return path when such section or point of the elongated flexible magnetic control 50 is in its first position than when in its second position. It is not required for all embodiments, however, that a given section or point of the elongated flexible magnetic control 50 when in the first position be bottomed-out in the gap 55. Instead, it can merely be disposed further into the gap than when in the second position.

As noted above, in FIGS. 1-3 and 6-9, the magnetic backing plate 60 comprises two plate segments 54 having confronting ends 54C that bound the gap 55. In embodiments of this nature, the elongated flexible magnetic control body 50 preferably has two generally opposed engagement faces 50S, and it is differentially bendable or otherwise deformable such that an extent to which it projects into the gap 55 at different points along its length is locally adjustable between first and second configurations. In FIGS. 1-3 and 6-9, the first configuration is characterized by the two engagement faces 50S of the elongated flexible magnetic control body 50 contacting confronting ends 54C of the two plate segments 54, whereas the second configuration is characterized by the two engagement faces of the elongated flexible magnetic control body being spaced apart from the confronting ends of the two plate segments 54. This is best appreciated by comparing FIGS. 1 and 2. Here, the illustrated gap 55 has a tapered configuration, such that when the elongated flexible magnetic control body 50 is in its first configuration, it is bottomed out in the gap. This, however, is not required. For example, when the gap is rectangular, the elongated flexible magnetic control body will not be physically bottomed out when in its first configuration.

The elongated flexible magnetic control body 50 preferably contains a fluid. A ferromagnetic fluid (or "ferrofluid") can, for example, be contained within a bendable wall portion WP. Reference is made to FIG. 10. The fluid can include particles 50P suspended in a carrier fluid CF. The particles 50P may be ferromagnetic particles of micrometer scale (e.g., having a diameter of 10 nm or less). The particles may be formed of such materials as iron, nickel, or cobalt, or their alloys, certain alloys of rare earth metals, or certain naturally occurring minerals, such as lodestone. The particles may, for example, comprise magnetite, hematite, or another compound containing iron. A surfactant is normally coated onto the particles 50P to prevent them from clumping. Oleic acid, citric acid, soy lecithin, and tetramethylammonium hydroxide are suitable materials for the surfactant. The carrier fluid CF may be an organic solvent. In some cases, oil is used as the carrier fluid. The particles 50P and carrier fluid CF preferably are selected such that the particles tend not to settle under normal conditions. A ferromagnetic fluid comprising both steel particles and oil can be used. Suitable ferrofluids are commercially available from Ferrotec, of Santa Clara, Calif., USA.

The present embodiments are advantageous for a number of reasons. For example, the elongated flexible magnetic control body 50 can provide a continuous or substantially continuous target-facing profile, which preferably is devoid of step-like transitions, along the length of the elongated flexible magnetic control body. This can be appreciated by referring to FIG. 3. In some cases, one or more (e.g., a series of) elongated flexible magnetic control bodies 50 extend along the entire length of the racetrack so as to provide a continuous or substantially continuous target-facing profile, which preferably is devoid of step-like transitions, spanning the entire length of the racetrack.

As noted above, the magnet assembly 300 can optionally be configured in a racetrack arrangement RT that includes: (i) two generally parallel elongated side regions SR, and (ii) two curved turnaround regions TA at opposite ends of the racetrack arrangement. In some embodiments of this nature, each curved turnaround region TA has a length, and the elongated flexible magnetic control body 50 spans at least a portion of the length of one of the two curved turnaround regions, such that the length of the elongated flexible magnetic control body extends along a curved (e.g., semicircular) path. In such cases, the elongated flexible magnetic control body 50 may span at least half of the length (or substantially the entire length, or the entire length) of one of the two curved turnaround regions. Thus, the elongated flexible magnetic control body 50 may delineate a semi-annular shape.

In the present embodiments, the magnet assembly 300 further includes an actuator system 1300 comprising a series of adjustments 130 spaced apart along the length of the elongated flexible magnetic control body 50. The adjustments 130 are configured such that the elongated flexible magnetic control body 50 bends locally, so as to project different extents into the gap 55 at different points along the length, in response to operation (e.g., movement) of one or more of the adjustments. Preferably, the elongated flexible magnetic control body 50 is mounted to such adjustments 130 at locations spaced apart along the length of the elongated flexible magnetic control body.

In connection with the adjustability of the elongated flexible magnetic control body 50, some embodiments involve an adjustment (e.g., an adjustment assembly) 130 comprising one or more threaded shafts 30 coupled to the elongated flexible magnetic control body (optionally via a mount plate or shaft 51) such that it moves toward the sputtering target 90 (e.g., further into the gap 55) in response to rotation of the threaded shaft(s) in a first direction, and moves away from the sputtering target (e.g., further out of the gap) in response to rotation of the threaded shaft(s) in a second direction.

In the embodiment of FIGS. 1 and 2, each adjustment 130 comprises two laterally spaced-apart threaded shafts 30. In other embodiments, each adjustment comprises a single threaded shaft. It is to be appreciated that based upon the length of the elongated flexible magnetic control body 50, it will typically be coupled to a series of longitudinally spaced-apart threaded shafts 30.

In embodiments where the elongated flexible magnetic control body 50 is adjustable by virtue of one or more threaded shafts 30, each threaded shaft can optionally be coupled to a motor 20 configured to rotate such threaded shaft(s). Thus, in certain embodiments, the elongated flexible magnetic control body 50 is adapted to bend such that a desired section or point thereof moves between the first and second positions in response to operation of a motor. This can also be the case for embodiments that do not include the threaded shafts; the adjustments are by no means required to include a threaded shaft.

Further, in certain embodiments, the system includes a control unit 10 connected with each motor 20, e.g., to control rotation of one or more threaded shafts 30. When provided, the control unit 10 preferably is located at a position external to the sputtering chamber 200, whereby an operator can initiate movement/adjustment of the elongated flexible magnetic control body 50 relative to the sputtering target 90 from outside the sputtering chamber 200 without having to open the sputtering chamber, stop sputtering the target 90, or both.

When provided, the control unit 10 can be operated in different ways to adjust the magnetic field 150. This can be done on demand, e.g., by virtue of an operator using the control unit 10 to initiate adjustments when desired. Additionally or alternatively, the control unit 10 itself can autonomously initiate automated corrections or adjustments that impact film uniformity. For example, any of variety of conventional film thickness measurement systems can be incorporated into the sputter deposition system and coupled with the control unit 10. In such cases, the control unit can be adapted to determine when significant thickness non-uniformities are occurring at certain locations on the glass, and automatically make adjustments to improve uniformity.

In certain alternate embodiments that include the threaded fasteners 30, their adjustment does not involve operating motors. Instead, the adjustments are done manually, e.g., using hand-held tools to independently adjust the local positioning of the elongated flexible magnetic control body. For example, the fasteners 30 can have heads 31 with standard or Phillips-type screwdriver slots, polygonal recesses for receipt of an Allen-wrench-type tool, or an exterior configuration shaped for engagement by a wrench or the like. In such embodiments, an operator can manually rotate one or more of the fasteners 30 so as to adjust the configuration of (e.g., to bend or otherwise locally deform the) elongated flexible magnetic control body as desired.

Moreover, as noted above, the adjustments 130 do not require threaded shafts. Instead, various types of moveable wedge members can be used. Another possibility is to employ a series of moveable bodies (e.g., moveable plates, rods, or the like) mounted to the elongated flexible magnetic control body, either continuously along its length or at positions spaced-apart along its length.

Whether or not the adjustment 130 comprise threaded shafts, each adjustment preferably is coupled to a motor 20 configured to move such adjustment selectively toward or away from the sputtering target 90. This is perhaps best appreciated by comparing FIGS. 1 and 2. Moreover, the sputter deposition assembly 100 preferably includes a control unit 10 connected with each motor 20 to control movement of the adjustments 130. In preferred embodiments, the control unit 10 is located at a position external to the sputtering chamber 200, such that an operator can initiate movement of the adjustments 130 (and thereby bend or otherwise deform the elongated flexible magnetic control body) from outside the sputtering chamber 200 without having to open the sputtering chamber, stop sputtering the target 90, or both.

In some embodiments, to get signals and power inside the sputtering chamber 200 (vacuum) and inside the cathode body, a programmable computer is set-up outside the coater. The computer is programmed to run a program addressing the individual motors 20 inside, with feedback to indicate the current location of different sections or points of the elongated flexible magnetic control body 50. The motors can optionally be stepper motors, and the system may be set up to count forward and backward steps. The power to step the motors can optionally be fed into the cathode from a power-source outside the coater, similar to the cathode cooling water. Sealing to atmosphere can be done by multiple pin high vacuum capable feedthroughs. The interface (computer/motor) used to direct the stepping signals can optionally be outside the coater, e.g., permanently attached to the top lid, which carries the installations supplying and controlling the cathode. The motors are located inside the internal vacuum of the cathode. To protect them from overheating, they can optionally be cooled using the available cooling water by heat conducting attachment. In other embodiments, only one power line and one signal line connect the control computer (outside vacuum) to the inside of the cathode. The interface to multiplex the stepping power to the addressed motor can optionally be inside the body of the cathode. In various embodiments of many such types, the inside of the cathode will be at different high voltages (against ground) during operation. In such cases, it will be appropriate to use high voltage insulation gear (insulation transformers) capable of safe transformation of the stepping power-signals and the multiplexer command signals to the motors and controls inside the cathode.

In some cases, the elongated flexible magnetic control body 50 is mounted movably relative to a non-magnetic support wall 40. In such cases, the non-magnetic support wall 40 (or at least a mount portion thereof) preferably is located further from the adjacent rear wall 91 of the sputtering target 90 than is the magnetic backing plate 60. Thus, the elongated flexible magnetic control body 50 may be mounted movably between a non-magnetic support wall 40 and the magnetic backing plate 60. The magnet assembly 300, for example, can optionally comprise a non-magnetic support wall 40 to which are mounted a plurality of threaded shafts 30 of the nature described above. As is perhaps best shown in FIGS. 1 and 2, such threaded shafts 30 can optionally be mounted in one or more corresponding bores 42 of the non-magnetic support wall 40. Here, the magnetic control body 50 is mounted movably in a channel 45 or other space bounded collectively by the non-magnetic support wall 40 and the magnetic backing plate 60.

With reference to FIGS. 1, 2, and 6-10, the system preferably includes a cooling plate 80 that defines a cooling channel 85 through which water flows during sputtering. The illustrated cooling plate 80 is carried alongside the rear surface 91 of the sputtering target 90, optionally such that the cooling channel 85 is located directly between the first 70 and second 70' permanent magnets.

In certain embodiments, the magnet assembly 300 is devoid of any movably-mounted permanent magnets located directly between the two laterally spaced-apart magnets 70, 70'. More generally, the magnet assembly 300 preferably is devoid of any permanent magnets located directly between the two laterally spaced-apart magnets 70, 70'. Additionally or alternatively, the magnet assembly 300 can optionally be devoid of any moveable magnetic (e.g., ferromagnetic or ferrimagnetic) bodies, such as shunts, located directly between the two laterally spaced-apart magnets 70, 70'.

Preferably, the gap 55 is an elongated gap having a racetrack configuration RT that includes two parallel elongated straight regions SR and two curved turn-around regions TA. Reference is made to FIG. 4. As noted above, the elongated flexible magnetic control body 50 is bendable or otherwise deformable locally so that, if desired, different sections or points of it can be disposed in the gap 55 to different extents. In some embodiments, the gap 55 is provided with (e.g., receives) at least a portion of one or more elongated flexible magnetic control bodies located at: (i) each of the two parallel elongated straight regions SR of the elongated racetrack configuration RT, and (ii) each of the two curved turn-around regions TA of the elongated racetrack configuration. This is perhaps best appreciated by referring to FIGS. 8 and 9.

Figure 7:
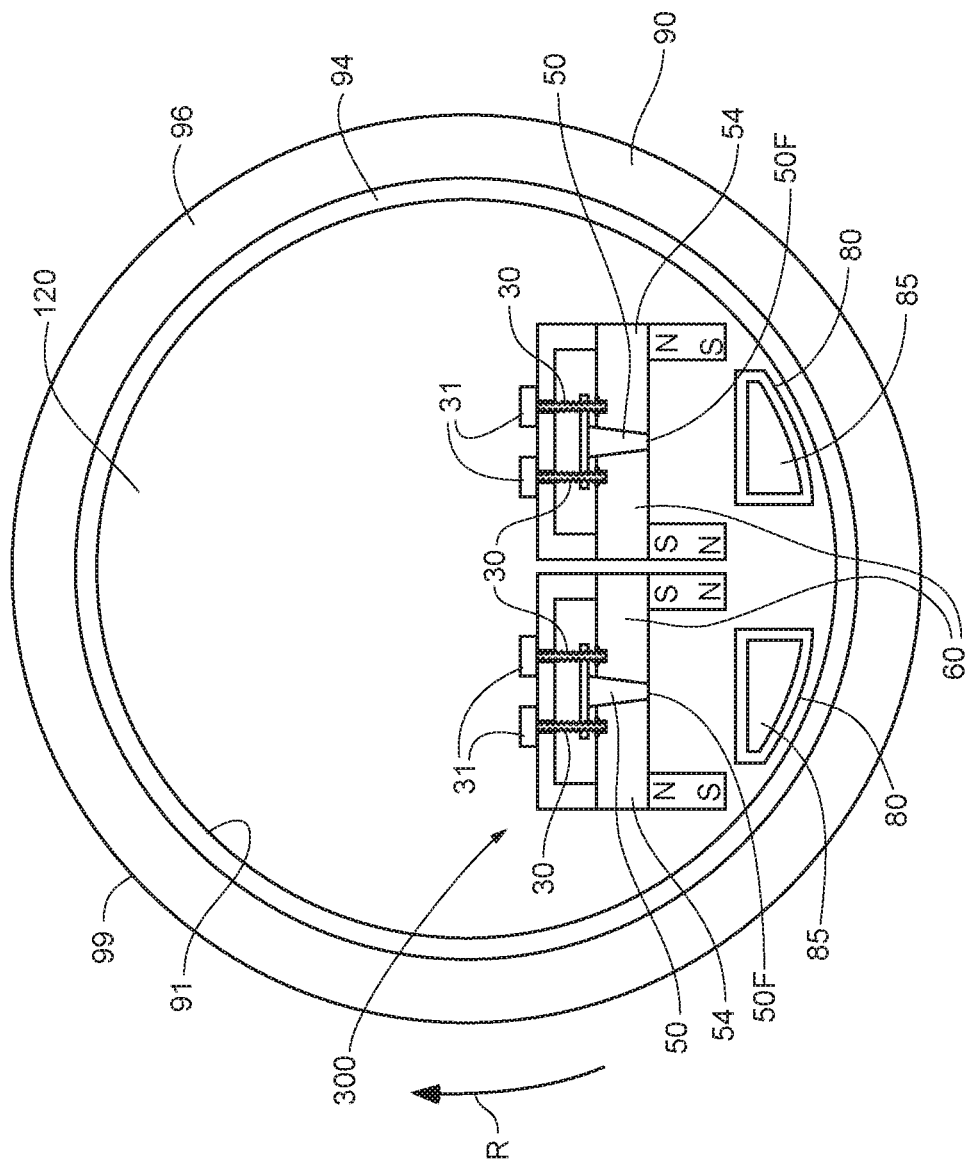
FIG. 7 is a schematic cross-sectional end view of a sputter deposition assembly including a cylindrical sputtering target and an adjustable magnet assembly in accordance with certain embodiments of the invention.

The system can involve a planar or cylindrical sputtering target 90. FIGS. 1-6 and 10 depict planar targets, whereas FIG. 7 depicts a cylindrical target. In many cases, the target 90 will include a support plate (or, in the case of a cylindrical target, a support tube) 94 on which a layer of sputterable material 96 is provided. It will be appreciated that many different sputterable materials can be used, depending upon the film(s) to be deposited. In certain embodiments, the sputterable material includes both indium and tin. The sputterable material, for example, can be a metallic indium-tin compound (e.g., an alloy comprising or consisting of indium and tin). In other embodiments, the sputterable material includes silver. The sputterable material, for example, can consist of metallic silver or a metallic alloy comprising silver. These examples are by no means limiting. To the contrary, the sputterable material of the present target 90 can have a wide variety of compositions, depending upon the type of film to be deposited. Other non-limiting possibilities for the sputterable material include titanium, titanium suboxide, silicon (optionally doped with a small amount of aluminum), zinc, tin, or a metallic compound of zinc and tin.

If desired, one or more intermediate layers can be provided between the optional support plate (or support tube) and the layer of sputterable material. One or more conventional adhesion layers may be beneficial, depending upon the compositions of the sputterable material and the target backing. When provided, an adhesion layer may have a coefficient of thermal expansion between that of the target backing and that of the sputterable material. Skilled artisans will be familiar with various options for such interlayers. Further, it is to be appreciated that in some embodiments, the target does not have a separate backing plate or backing tube, but rather the entire target is formed by the sputterable material itself.

In embodiments involving a cylindrical sputtering target, the magnet assembly 300 is mounted inside the target 90, i.e., within an interior space 120 bounded by the target. This is shown in FIG. 7. Preferably, one or more cooling fluid channels (e.g., water channels) 85 are also provided inside the target 90 so as to be in thermal contact with the rear surface 91 of the target 90. When a cylindrical target is used, it is conventional to mount it rotatably to an end block of the sputter deposition system. End blocks, and the manner in which cylindrical targets are mounted rotatably to one or two end blocks, are well known to skilled artisans.

As noted above, the magnet assembly 300 is mounted adjacent to a rear surface 91 of the target 90. The opposite surface of the target, i.e., the front surface 99, is defined by sputterable material. Thus, it is the front surface 99 of the target 90 from which sputterable material is ejected toward a substrate (e.g., a glass sheet) S during sputtering. In planar target embodiments like those of FIGS. 1, 2, 6, and 10, an erosion trench 97 is formed in the front surface 99 of the target 90 during sputtering.

As described previously, the magnetic field 150 forms a closed-loop tunnel in front of the target 90. Thus, during sputtering, the erosion of the front surface 99 of the target 90 results from ion bombardment of the target. This ion bombardment is caused by a high density region of plasma trapped by the magnetic field 150 adjacent to the front surface 99 of the target 90. An erosion trench 97, or an area of maximum erosion, will typically be located between (e.g., centered between) the laterally spaced-apart inner 70 and outer 70' primary magnets.

The magnet assembly 300 can optionally include a series of magnet assembly segments 500. In embodiments of this nature, each magnet assembly segment 500 preferably includes an inner magnet 70, an outer magnet 70', and a magnetic backing plate 60. These components have already been described. In some cases, the magnet assembly segments 500 are mounted end-to-end so as to collectively form a racetrack arrangement RT. Non-limiting examples are perhaps best understood with reference to FIGS. 4, 8, and 9.

The present magnet assembly 300 is advantageous in that the magnet assembly segments 500 need not be moved (e.g., optionally are mounted such that they are not independently moveable) in their entirety toward or away from the sputtering target 90 in order to locally adjust the magnetic field 150 adjacent the front surface 99 of the target 90. Instead, local adjustments can be made simply by locally bending or otherwise deforming one or more elongated flexible magnetic control bodies 50, e.g., by independently moving one or more adjustments 130 toward or away from the sputtering target 90.

As noted above, the magnet assembly 300 comprises a plurality of primary magnets, including a series of inner magnets 70 and a series of outer magnets 70'. Preferably, the outer magnets 70' all have the same field orientation and are arranged in a closed loop. Likewise, the inner magnets 70 preferably all have the same field orientation (which is opposite to that of the outer magnets) and are arranged in a closed loop. One suitable closed loop arrangement of this nature can be appreciated by referring to FIG. 4, which schematically depicts an embodiment wherein the magnet assembly 300 is configured in a basic racetrack arrangement RT having: (i) two generally parallel elongated side regions SR, and (ii) two curved turnaround regions TA at opposite ends of the racetrack arrangement. The racetrack arrangement RT can optionally consist of the two side regions SR and the two turnaround regions TA. It is to be understood, however, that the magnet assembly 300 can alternatively be configured in various other arrangements so as to create racetracks of different shapes.

Figure 8:
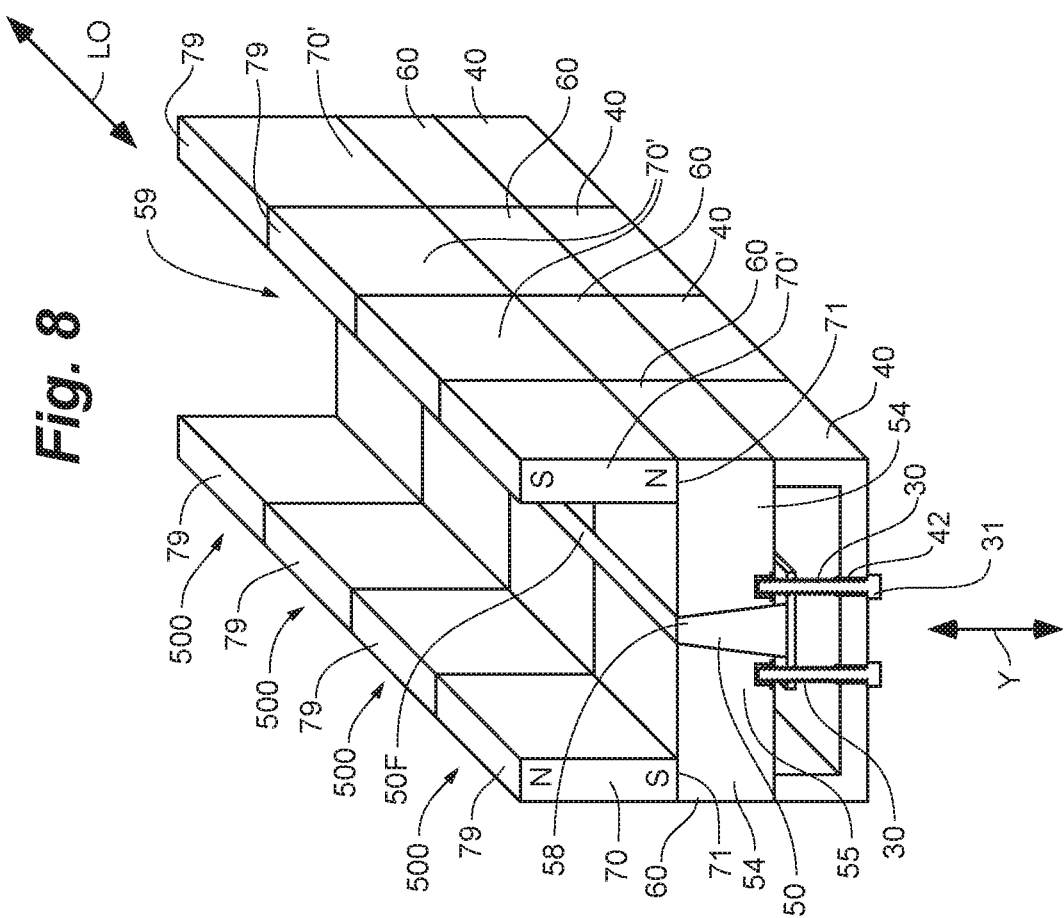
FIG. 8 is a schematic perspective view of a portion of an elongated side region of an adjustable magnet assembly in accordance with certain embodiments of the invention.
Figure 9:
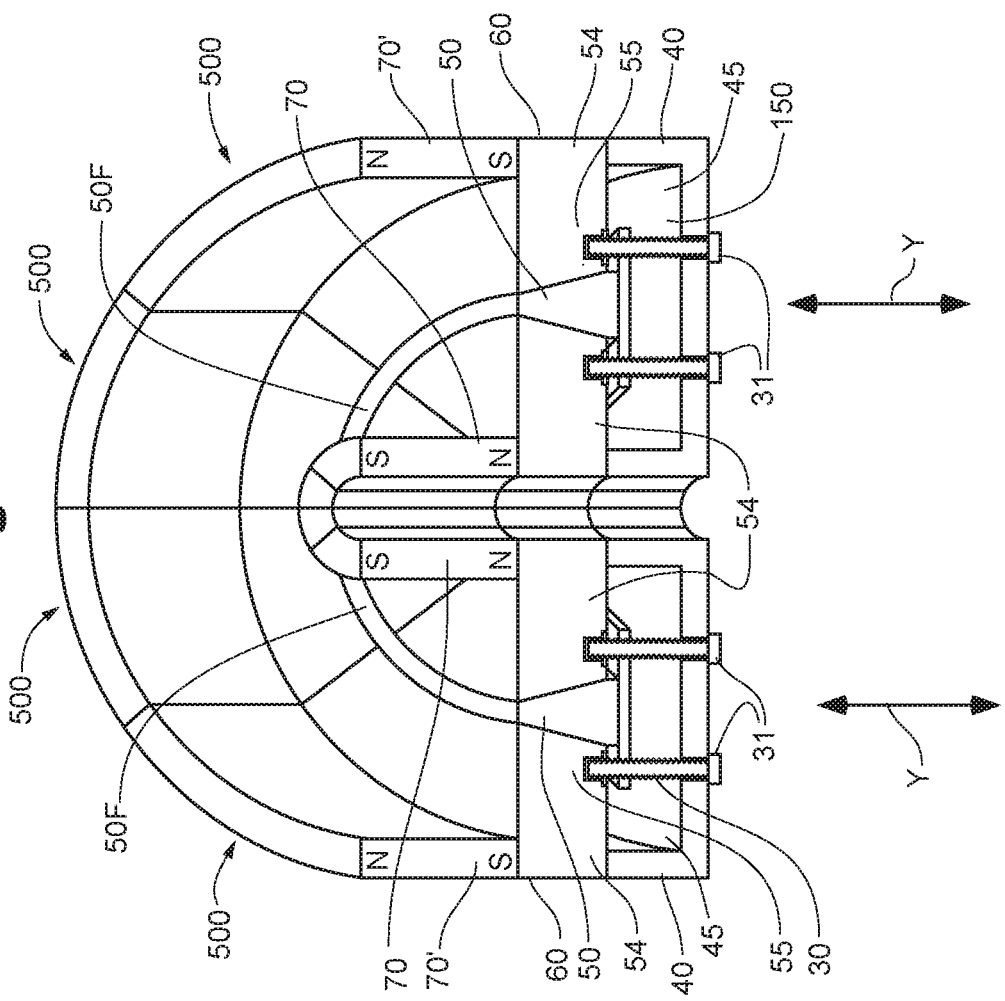
FIG. 9 is a schematic perspective view of a curved turnaround region of an adjustable magnet assembly in accordance with certain embodiments of the invention.

As is perhaps best appreciated by referring to FIGS. 8 and 9, the series of inner magnets 70 and the series of outer magnets 70' can advantageously be coupled so as to constitute a series of adjacent magnet pairs, with each pair consisting of an inner magnet 70 and an outer magnet 70'. As illustrated, the two magnets 70, 70' of each adjacent magnet pair are spaced apart so as to confront each other. Preferably, the space directly between the two magnets 70, 70' of each adjacent magnet pair is devoid of any magnet. In such cases, for example, there is no permanent magnet located directly between the two primary magnets 70, 70' of each adjacent magnet pair.

In FIGS. 1-4 and 7-10, the inner 70 and outer 70' magnets are shown as discrete permanent magnets. More generally, though, each magnet assembly segment 500 can have two or more permanent magnets, two or more coils, one permanent magnet and one coil, etc. In some cases, the two magnetic backing plate segments 54 are formed of iron. In other cases, cobalt or nickel is used.

In FIGS. 1-4, 7-9, and 11, the inner 70 and outer 70' magnets are mounted directly against the magnetic backing plate 60. In more detail, the illustrated inner 70 and outer 70' magnets are both mounted alongside (e.g., carried against) the same side of the magnetic backing plate 60. Alternatively, the inner and outer magnets of each magnet assembly segment can be mounted alongside (e.g., carried against) two opposed ends of a magnetic backing plate (e.g., such that the magnetic backing plate segments 54 are positioned between end regions of the inner and outer magnets). Thus, the magnetic backing plate 60 and two magnets 70, 70' of each magnet assembly segment 500 preferably collectively form a U-shaped configuration in which the magnetic backing plate defines a base and the two permanent magnets define sides. In such cases, a channel 59 is formed collectively by the magnetic backing plate 60 and the spaced-apart, confronting primary magnets 70, 70'. As noted above, this channel 59 preferably is devoid of any magnet. For example, there preferably is no secondary (or "auxiliary") magnet in the channel 59.

Thus, a series of magnet assembly segments 500 can be positioned so as to collectively form a racetrack arrangement RT. In some cases, the magnet assembly segments 500 of such a series are mounted end-to-end so as to collectively form a racetrack arrangement RT. With reference to FIGS. 8 and 9, the segments 500 can be carried against one another, optionally such that adjacent segments are in contact with each other. In some cases, the magnet assembly segments are mounted end-to-end so as to be spaced apart from one another. In such cases, spacers, mounting hardware, and/or other components can be located between adjacent magnet assembly segments.

In certain embodiments, a plurality of magnet assembly segments 500 are located at (e.g., define) each of the curved turnaround regions TA. In such embodiments, at each curved turnaround region TA there are multiple magnet assembly segments 500. For example, at least three of the magnet assembly segments 500 may define each of the curved turnaround regions TA. Reference is made to FIG. 9, wherein four magnet assembly segments 500 are located at (e.g., define) each of the curved turnaround regions TA. In other embodiments, each curved turnaround region is formed by two magnet assembly segments. When a planar target is used with such a system, such two magnet assembly segments at each curved turnaround region may correspond to the two regions A, B shown at each end of FIG. 5.

In some cases, each magnet assembly segment 500 at each curved turnaround region TA is a magnet assembly corner segment having a sector shape. If desired, there can be at least two, or at least three (e.g., four) such magnet assembly corner segments at each curved turnaround region. FIG. 9 shows one such embodiment. Here, each magnet assembly corner segment has a generally triangular configuration, such that the when the magnet assembly corner segments are assembled together, they collectively form a semi-circular (e.g., half circle) shape.

When the magnet assembly 300 comprises a plurality of magnet assembly segments 500, each magnet assembly segment preferably has (e.g., receives, or is otherwise equipped with) at least a portion of an elongated flexible magnetic control body 50 that is locally moveable (e.g., bendable or otherwise deformable) selectively toward or away from the sputtering target 90. It can thus be appreciated, with reference to FIGS. 8 and 9, that one or more points or sections of an elongated flexible magnetic control body 50 can be moved locally in either direction of arrow Y. This allows the magnet assembly segments 500 to be adjusted individually without actually changing the respective distances of their permanent magnets 70, 70' from the adjacent rear surface 91 of the target 90. By adjusting the magnet assembly segments 500 individually in this manner, an operator can locally adjust the sputtering rate. Thus, it is possible to tailor the sputter deposition assembly 100 for each process to be carried out and/or to make changes over time as a process progresses. The particular positions desired for the different points or sections of the elongated flexible magnetic control body or bodies of the different magnet assembly segments 500 can be optimized for each unique process to be conducted. Moreover, as a particular process proceeds, it is possible to fine tune the resulting film uniformity based on changes in the process over time (as may result from the target becoming increasingly consumed, etc.).

The magnet assembly 300 can optionally have a plurality of individually adjustable segments 500 at each curved turnaround region TA. In the embodiment of FIG. 9, various points or sections of the elongated flexible magnetic control body or bodies 50 at each curved turnaround region TA can be moved individually in either direction of arrow Y. This allows an operator to adjust the sputtering rate locally along each turnaround region TA. This is advantageous because it can be challenging to maintain uniformity between the side regions and the turnaround regions.

It can thus be appreciated that the present sputter deposition assembly 100 provides exceptional flexibility in terms of contouring the magnetic field 150 by independently adjusting one or more points or sections of one or more elongated flexible magnetic control bodies 50 mounted on different magnet assembly segments 500.

FIG. 6 depicts a sputtering chamber 200 in accordance with certain embodiments of the invention. The sputtering chamber 200 in FIG. 6 is equipped with a single sputtering target 90. While a single planar target is shown, the sputtering chamber can alternatively have a single cylindrical sputtering target. As another alternative, the sputtering chamber can be equipped with two cylindrical targets or two planar targets.

FIG. 11 shows an embodiment of the invention wherein the magnetic backing plate comprises a plurality of layered metal sheets. Preferably, each of the layered metal sheets is formed of ferromagnetic or ferrimagnetic material. In the embodiment of FIG. 11, the magnetic backing plate 60 has two layered metal sheets 50A, 50B. However, three or more layered metal sheets 50A-50X can be used, if so desired.

In FIG. 11, the layered metal sheets 50A-50X are carried alongside one another in a layered arrangement having opposed first and second sides. Preferably, the layered arrangement is characterized by the layered metal sheets 50A-50X being locked in permanent contact with one another at the first side (on the right, as seen in FIG. 11), whereas at the second side (on the left, as seen in FIG. 11) the layered arrangement is expandable such that at least one of the layered metal sheets is configured to bend away from the sputtering target 90 (and/or away from at least another of the layered metal sheets) in response to operation of an actuator. In the embodiment of FIG. 11, the second side of the second sheet 50B is configured to bend away from the first sheet 50A. In some embodiments involving three or more sheets, the layered arrangement is expandable such that the second sides of two or more layered metal sheets are configured to bend away from the sputtering target (and/or away from at least another of the layered sheets).

The plurality of layered metal sheets 50A-50X comprises first 50A and second 50B metal sheets, each having opposed first and second faces. In FIG. 11, the first face of the first metal sheet 50A is in contact with both the distal end 71 of the first permanent magnet 70 and the distal end 71 of the second permanent magnet 70'. This, however, is not required. The second metal sheet 50B is separated from the first 70 and second 70' permanent magnets by at least the first metal sheet 50A. In FIG. 11, the first face of the second metal sheet 50B confronts the second face of the first metal sheet 50A. Preferably, when the layered metal sheets 50A-50X are in a compact position, the first face of the second metal sheet 50B is in contact with the second face of the first metal sheet 50A, whereas when the layered metal sheets are in an expanded position, the first face of the second metal sheet 50B confronts, but is spaced apart from, the second face of the first metal sheet 50A. In certain embodiments involving three or more layered metal sheets 50A-50X, this relative positioning when in compact and expanded positions is provided for two or more of the layered metal sheets.

Preferably, the sputter deposition assembly 100 is configured such that the magnetic field 150 (e.g., an arc of magnetic field lines 155 thereof and/or a region thereof) located in front of the sputtering target 90 changes in strength, configuration, or both in response to bending one or more of the layered metal sheets 50A-50X away from the sputtering target 90. In embodiments wherein the magnetic backing plate comprises three or more layered metal sheets, the magnetic field preferably changes in response to bending two or more of the layered metal sheets away from the sputtering target. In the embodiment of FIG. 11, the magnetic field 150 changes in response to bending the second metal sheet 50B away from the first metal sheet 50A.

At least one of the layered metal sheets 50A-50X is a bendable, resilient metal sheet. In FIG. 11, for example, at least the second metal sheet 50B is a bendable, resilient metal sheet. In some cases, a plurality (optionally all) of the layered metal sheets 50A-50X are bendable, resilient metal sheets. The bendable metal sheet(s) preferably are thin plates of resilient metal. The thickness of each such sheet can be, for example, less than ⅓ inch, or less than ¼ inch. The second metal sheet 50B can optionally be a flexible metal leaf. If desired, a plurality (e.g., all) of the layered metal sheets 50A-50X can be flexible metal leafs. In such cases, the thickness of the flexible metal leaf(s) can be, for example, less than ⅛ inch, or even less than 1/16 inch. If desired, the first metal sheet can be a thicker, rigid metal plate of greater thickness.

In the embodiment of FIG. 11, the layered metal sheets 50A-50X extend from a first side, which is adjacent (and optionally contacts) the first permanent magnet 70, to a second side, which is adjacent (and optionally contacts) the second permanent magnet 70'. Preferably, the layered metal sheets 50A-50X are carried alongside one another in a layered arrangement characterized by the layered metal sheets being locked in permanent contact with one another at the first side, whereas at the second side the layered arrangement is expandable such that at least the second metal sheet 50B is configured to bend away from the sputtering target 90 (and/or away from first metal sheet 50A) in response to operation of an actuator.

In the present embodiment, the actuator can comprise a threaded shaft 30 extending through one or more (optionally all) of the layered metal sheets 50A-50X. In FIG. 11, the threaded shaft 30 extends through the layered metal sheets at their second side. When provided, the threaded shaft 30 can be coupled to a motor 20 that is configured to rotate the threaded shaft. One non-limiting example is shown in FIG. 11. In this embodiment, rotation of the threaded shaft 30 in one direction (e.g., clockwise) causes the second end of the second metal sheet 50B to move (e.g., bend) away from the sputtering target 90 (and away from the first metal sheet 50A), whereas rotation of the threaded shaft in an opposite direction (e.g., counterclockwise) causes the second end of the second metal sheet to move (e.g., bend) toward the sputtering target (and toward the first metal sheet). In FIG. 11, the threaded shaft 30 is mounted for rotation in both a non-threaded bore defined by the first metal sheet 50A and an internally threaded bore defined by the second metal sheet 50B. Due to the threaded engagement of the externally threaded shaft 30 and the internally threaded bore defined by the second metal sheet 50B, by rotating the threaded shaft in one direction or the other, the second metal sheet can be made to move selectively either away from the sputtering target 90 (and away from the first metal sheet 50A) or toward the sputtering target (and toward the first metal sheet). It is to be appreciated, however, that this is merely one non-limiting example of how to actuate the layered metal sheets. Given the present teaching as a guide, many other suitable actuator arrangements will become apparent to skilled artisans.

In the present embodiment, the sputter deposition assembly preferably includes a control unit connected with the motor to control rotation of the threaded shaft. When provided, the control unit preferably is located at a position external to the sputtering chamber, such that an operator can initiate bending of at least one of the layered metal sheets from outside the sputtering chamber without having to open the sputtering chamber, stop sputtering the target, or both. The control unit 10 and motor 20 can be of the same basic nature as was described above with respect to the embodiments of FIGS. 1-3 and 6-10.

With continued reference to FIG. 11, the layered arrangement at the second side is adjustable between first and second configurations. The first configuration is a compact configuration characterized by the layered metal sheets 50A-50X being in contact with one another at the second side. The second configuration is an expanded configuration characterized by the layered metal sheets 50A-50X being spaced apart from one another at the second side. The illustrated sputter deposition assembly is configured such that the magnetic field 150 (e.g., an arc of magnetic field lines 155 thereof and/or a region thereof) located in front of the sputtering target 90 changes in strength, configuration, or both in response to adjustment (e.g., bending) of the layered arrangement at the second side between the first and second configurations.

In some cases, the plurality of layered metal sheets 50A-50X comprises three metal sheets, and the first configuration is a compact configuration characterized by the first metal sheet being in contact with the second metal sheet at the second side, while the second metal sheet is in contact with the third metal sheet at the second side. In such cases, the second configuration is an expanded configuration characterized by the second metal sheet being spaced apart from the first metal sheet at the second side, while the third metal sheet is spaced apart from the second metal sheet at the second side.

In FIG. 11, the sputter deposition assembly further comprises a cooling plate 80 that defines a cooling channel 85 through which water flows during sputtering. The illustrated cooling plate 80 is carried alongside the rear surface 91 of the sputtering target 90 such that the cooling channel 85 is located between the first 70 and second 70' permanent magnets. It is to be appreciated, however, that cooling can alternatively be provided by various other cooling arrangements.

The invention also provides methods of operating a sputter deposition assembly 100. The sputter deposition assembly 100 can be of the nature described above. For example, it can include a sputtering chamber 200, a sputtering target 90, and a magnet assembly 30. The magnet assembly 300 is mounted adjacent to a rear surface 91 of the target 90. The magnet assembly 300 includes a magnetic backing plate 60 and spaced-apart first 70 and second 70' permanent magnets. The first 70 and second 70' permanent magnets each have a proximal end 79 and a distal end 71. The distal end 71 is further from the target 90 than is the proximal end 79. The method involves using the magnet assembly 300 to create a magnetic field 150 comprising field lines 155 that extend from the proximal end 79 of the first magnet 70, through the sputtering target 90, along an arc located in front of the sputtering target, back through the sputtering target, to the proximal end 79 of the second permanent magnet 70', through the second permanent magnet, along a return path, and to the distal end 71 of the first permanent magnet 70. The return path passes through the magnetic backing plate 60 of the magnet assembly 300.

In a first group of embodiments, the magnetic backing plate 60 has a gap 55, and an elongated flexible magnetic control body 50 is mounted adjacent (e.g., received in) the gap. Magnetic backing plates of this type have already been described (e.g., with respect to FIGS. 1-3 and 6-10). In another embodiment, the magnetic backing plate 60 comprises a plurality of layered metal sheets 50A-50X. Magnetic backing plates of this type have also been described (e.g., with respect to FIG. 11). The present methods can employ a magnetic backing plate 60 of either type.

Thus, in one group of embodiments, the method involves moving (e.g., bending or otherwise deforming) one or more sections or points of an elongated flexible magnetic control body 50 between first and second positions. In such cases, one or more sections or points of the elongated flexible magnetic control body 50 when in the first position are disposed further into the gap 55 than when in the second position. This can be appreciated by comparing FIGS. 1 and 2. Such movement of one or more sections or points of an elongated flexible magnetic control body 50 between first and second positions preferably involves such section(s) or point(s) moving either further into or further out of the gap 55.

In more detail, the method preferably involves moving one or more sections or points of an elongated flexible magnetic control body 50 toward or away from the sputtering target 90 (e.g., by bending or otherwise deforming the elongated flexible magnetic control body). In such cases, one or more sections or points of the elongated flexible magnetic control body 50 move away from the sputtering target 90 in moving from the first position to the second position, whereas it/they move toward the sputtering target in moving from the second position to the first position. This too can be appreciated by comparing FIGS. 1 and 2.

Referring now to FIG. 6, it can be appreciated that movement of one or more sections or points of the elongated flexible magnetic control body 50 toward the sputtering target 90 may involve it/they moving toward the path of substrate travel. Movement of such one or more sections or points of an elongated flexible magnetic control body 50 away from the sputtering target 90 may involve it/they moving away from the path of substrate travel.

Movement of one or more sections or points of an elongated flexible magnetic control body 50 between the first and second positions causes a magnetic field 150 (e.g., an arc of magnetic field lines 155 thereof and/or a region thereof) located in front of the sputtering target 90 to change in strength, configuration, or both. For example, if it is desired to increase the local sputtering rate adjacent one or more sections or points of an elongated flexible magnetic control body, such sections or points of the elongated flexible magnetic control body can be moved (e.g., bent or otherwise deformed) further into the gap 55. As explained previously, this reduces the resistance of the return path. In contrast, if it is desired to decrease the local sputtering rate adjacent to one or more sections or points of an elongated flexible magnetic control body 50, such sections or points of the elongated flexible magnetic control body can be moved (e.g., bent or otherwise deformed) further out of the gap 55. This increases the resistance of the return path.

In certain embodiments, one or more sections or points of an elongated flexible magnetic control body 50 when in the first position are in contact with two confronting faces 54C of the magnetic backing plate 60, and when in the second position are spaced apart from those confronting faces of the magnetic backing plate. In some embodiments of this nature, the method includes moving (e.g., bending or otherwise deforming) such one or more sections or points of an elongated flexible magnetic control body 50 from the first position to the second position. Additionally or alternatively, the method may involve moving (e.g., bending or otherwise deforming) one or more sections or points of the elongated flexible magnetic control body 50 from the second position to the first position.

As noted above, an elongated flexible magnetic control body 50 can optionally be coupled to one or more motors 20. When provided, such a motor 20 can be coupled with the elongated flexible magnetic control body 50 directly, via one or more threaded shafts 30 (e.g., in the manner described above), or via one or more other drive members. In such cases, the method involves operating one or more motors 20 to move one or more sections or points of the elongated flexible magnetic control body 50 between the first and second positions. This movement (e.g., by bending or otherwise deforming) can be of the nature described above. The system can optionally include a control unit 10 connected with the motor(s) 20 to control operation of the motor(s). When provided, the control unit 10 preferably is located at a position external to the sputtering chamber 200, whereby an operator can initiate movement (e.g., bending or other deformation) of the elongated flexible magnetic control body 50 between the first and second positions from outside the sputtering chamber without having to open the sputtering chamber, stop sputtering the target, or both.

As discussed previously, the gap 55 preferably is a channel having an elongated racetrack configuration that includes two parallel elongated straight regions SR and two curved turn-around region TA. In embodiments of this nature, the magnet assembly 300 may include (and the gap 55 may receive) a plurality of elongated flexible magnetic control bodies. For example, a first elongated flexible magnetic control body may be received in the gap so as to extend along a first of the turnaround regions TA, a second elongated flexible magnetic control body may be received in the gap so as to extend along a second of the turnaround regions TA, a third elongated flexible magnetic control body may be received in the gap so as to extend along a first of the side regions SR, and a fourth elongated flexible magnetic control body may be received in the gap so as to extend along a fourth of the side regions SR. In such cases, the method preferably involves independently moving (e.g., bending or otherwise deforming) two or more of the elongated flexible magnetic control bodies relative to the sputtering target 90. Another possibility is to have a single elongated flexible magnetic control body extend along the entire racetrack. Still another possibility is to have two elongated flexible magnetic control bodies collectively extend along the entire racetrack. In certain embodiments, elongated flexible magnetic control bodies are provided only at the two turnaround regions, but not at the side regions. It is to be appreciated that other variants of this nature can be used (e.g., eight elongated flexible magnetic control bodies may collectively span the entire racetrack).

In the embodiments of FIGS. 1-3 and 6-10, the elongated flexible magnetic control body 50 is coupled to a plurality of motors 20. Preferably, it is coupled, at locations spaced apart along the length of elongated flexible magnetic control body 50, to a series of motors 20. As noted above, the elongated flexible magnetic control body 50 can optionally be coupled to each motor via an adjustment 130. The present method can thus involve operating two or more of motors 20 to move two or more sections or points of the elongated flexible magnetic control body 50 such that those sections or points are disposed different distances into the gap 55. Further, the system can advantageously include a control unit 20 operably coupled with the motors 20 and located at a position external to the sputtering chamber 200. In such cases, an operator can initiate independent movement of two or more sections or points of the elongated flexible magnetic control body 50 without having to open the sputtering chamber 200, stop sputtering the target 90, or both.

In some embodiments, one or more elongated flexible magnetic control bodies 50 extend along (or "span") the entirety of the racetrack RT. In other embodiments, one or more elongated flexible magnetic control bodies 50 are provided only at certain locations on the racetrack RT (e.g., locations of particular interest for process control, such as the turnaround regions TA). For example, the invention provides embodiments wherein the sputter deposition assembly 100 is capable of addressing the so-called "cross-corner effect." Referring to FIG. 4, it will be appreciated that the plasma density at the incoming corner of each turnaround lane TA may be greater than at other locations on the racetrack. As a consequence, target erosion may proceed more rapidly at the incoming corners of the turnaround lanes TA than at other locations on the racetrack. As depicted schematically in FIG. 4, this can cause the target 90 to be consumed prematurely at the hot spots H. That is, the sputterable material at these hot spots H may be consumed sooner than at other locations on the target 90. Moreover, the higher rate of target erosion at these hot spots can cause non-uniformity of the sputtered film. The present sputter deposition assembly may be advantageous for eliminating or reducing these phenomena.

Thus, in certain embodiments, the invention provides a sputter deposition assembly 100 that can compensate for (i.e., reduce or eliminate) the cross-corner effect. In the present embodiments, the sputter deposition assembly 100 includes a sputtering chamber 200, a sputtering target 90, and a magnet assembly 300. These components can be of the nature described above. The magnet assembly 300, for example, is mounted adjacent to a rear surface 91 of the sputtering target 90. The magnet assembly 30 has a series of primary magnets 70, 70' that generate a magnetic field 150, such that the magnetic field is positioned to establish, adjacent a front surface 99 of the target 90, a plasma racetrack RT around which electrons travel continuously during sputtering. The plasma racetrack RT has two generally parallel elongated side lanes SR, and two curved turnaround lanes TA at opposite ends of the plasma racetrack. Each curved turnaround lane TA has an incoming corner region and an outgoing corner region. Reference is made to FIG. 4.

In some cases, the magnet assembly 300 includes one or more elongated flexible magnetic control bodies 50 that are locally adjustable (e.g., bendable or otherwise deformable) so as to project further into the gap 55 at an outgoing corner region than at the adjacent incoming corner region. In some embodiments of this nature, the one or more elongated flexible magnetic control bodies 50 have a section or point at an ingoing corner region that projects less into the gap 55 than do other sections or points at the adjacent incoming corner region and/or at side regions SR of the racetrack RT. In some cases, the one or more elongated flexible magnetic control bodies 50 project less into the gap 55 at the ingoing corner regions than at any other sections or points of the elongated flexible magnetic control bodies.

In the present embodiments, the one or more elongated flexible magnetic control bodies 50 include two sections located respectively at the two incoming corner regions of the two curved turnaround lanes TA and two sections located respectively at the two outgoing corner regions of the two curved turnaround lanes. These four sections of the one or more elongated flexible magnetic control bodies 50 are independently moveable (e.g., bendable or otherwise deformable) selectively toward or away from the adjacent region of the sputtering target 90.

Thus, an elongated flexible magnetic control body section at an incoming corner region preferably is adjustable relative to an elongated flexible magnetic control body section at an adjacent outgoing corner region (by saying "adjacent" here, we refer to the outgoing corner region of the same turnaround lane TA). This adjustment changes an incoming-corner-to-outgoing-corner plasma density ratio. By providing independent adjustments at the incoming and outgoing corner regions, it is possible to change the magnitude of the plasma density at the incoming corner region relative to the plasma density at the adjacent outgoing corner region. For example, the present magnet assembly 300 can be configured such that a relative adjustment of an elongated flexible magnetic control body section at an incoming corner region and an elongated flexible magnetic control body section at an adjacent outgoing corner region establishes a plasma density at the incoming corner region that is substantially equal to the plasma density at the adjacent outgoing corner region. This preferably is the case for each turnaround lane TA.

In the present embodiments, the sputtering chamber 200 and sputtering target 90 can be of the nature described previously. With respect to the magnet assembly 300 in the present embodiments, it may have one or more elongated flexible adjustable magnet control bodies 50 that span the entirety of the racetrack RT. This, however, is not required. For example, in the present embodiments, there may simply be an individual flexible magnetic control body 50 at each incoming corner of each turnaround region TA and an individual flexible magnetic control body at each outgoing corner of each turnaround region. In such cases, the rest of the racetrack may or may not be equipped with any elongated flexible adjustable magnet control bodies. Thus, in some of the present embodiment, while the magnet assembly 300 is not adjustable about the entire racetrack RT, it is still capable of compensating for the cross-corner effect. This is merely one example; it may be desirable to provide various other arrangements wherein the magnet assembly 300 is adjustable along only part of the racetrack RT.

The invention provides methods of operating a sputter deposition assembly 100 so as to compensate for the cross-corner effect. In these methods, the sputter deposition assembly 100 includes a sputtering chamber 200, a sputtering target 90, and a magnet assembly 300. The magnet assembly 300 is located adjacent to a rear surface 91 of the target 90. The magnet assembly 300 has a series of primary magnets 70, 70' generating a magnetic field (e.g., a magnetron magnetic field) 150 that establishes, adjacent a front surface 99 of the target 90, a plasma racetrack RT around which electrons are travelling continuously and having two generally parallel elongated side lanes SR and two curved turnaround lanes TA at opposite ends of the plasma racetrack. Each curved turnaround lane TA has an incoming corner and an outgoing corner. The magnet assembly 300 includes a plurality of magnet assembly segments 500. Each magnet assembly segment 500 has an inner magnet 70, an outer magnet 70', and a magnetic backing plate 60. The magnet assembly 300 includes a first elongated flexible magnetic control body 50 section at a first of the incoming corner regions and a second elongated flexible magnetic control body section at a first of the outgoing corner regions. In the present methods, the "first" and "second" elongated flexible magnetic control body 50 sections are located respectfully at the incoming and outgoing corner regions of the same turnaround lane TA. The present methods involve independently adjusting (e.g., bending or otherwise deforming) the first and second elongated flexible magnetic control body sections so as to position them different distances from the adjacent rear surface 91 of the target 90 (i.e., such that they project different distances into the gap 55).

Thus, the first elongated flexible magnetic control body 50 section is positioned a first distance from the adjacent rear surface 91 of the target 90, while the second elongated flexible magnetic control body section is positioned a second distance from the adjacent rear surface of the target. The first and second distances here are different. For example, the first distance may be greater than the second distance, such that the first elongated flexible magnetic control body 50 section (which may be located at an incoming corner region of a turnaround lane TA) is further from the adjacent rear surface 91 of the target 90 than is the second elongated flexible magnetic control body section (which may be located at the adjacent outgoing corner region of the same turnaround lane TA). This may be advantageous to compensate for the above-noted cross-corner effect.

The present methods may involve moving (e.g., bending or otherwise deforming) the first elongated flexible magnetic control body 50 section relative to (i.e., toward or away from) the adjacent rear surface 91 of the target 90, moving the second elongated flexible magnetic control body section relative to the adjacent rear surface of the target, or moving both the first and second elongated flexible magnetic control body 50 sections relative to the adjacent rear surface of the target. As will be appreciated, this may involve moving the first elongated flexible magnetic control body 50 section further into the gap 55 than the second elongated flexible magnetic control body section.

In the present embodiments, the independent adjustment of the first and second elongated flexible magnetic control body 50 sections preferably changes an incoming-corner-to-outgoing-corner plasma density ratio. Thus, the magnitude of the plasma density at the incoming corner region relative to the magnitude of the plasma density at the adjacent outgoing corner region preferably changes when the first and second elongated flexible magnetic control body 50 sections are adjusted independently. For example, some embodiments involve moving the first elongated flexible magnetic control body 50 section to a position further from an adjacent rear surface 91 of the target 20 than is the second elongated flexible magnetic control body 50 section. Such movement of the first elongated flexible magnetic control body 50 section away from the adjacent rear surface 91 of the target 90 may decrease the plasma density at the incoming corner region of the turnaround lane TA in question. Thus, in some cases, the present methods involve moving the first elongated flexible magnetic control body 50 section away from the adjacent rear surface 91 of the target 90 so as to reduce the incoming-corner-to-outgoing-corner plasma density ratio. In some cases, the method involves performing such an independent adjustment at each turnaround lane TA of the racetrack RT.

Thus, by independently adjusting one or more elongated flexible magnetic control body 50 sections at an incoming corner region relative to one or more elongated flexible magnetic control body sections at the adjacent outgoing corner region, the magnitude of the plasma density at the incoming corner region preferably changes relative to the plasma density at the adjacent outgoing corner region. In certain preferred embodiments, the first and second elongated flexible magnetic control body 50 sections are adjusted independently so as to make the plasma density at the first incoming corner region substantially equal to the plasma density at the first outgoing corner region. Adjustments of this nature are preferably conducted for both turnaround lanes TA. These adjustment methods are advantageous in that they can compensate for the cross-corner effect.

In some embodiments of the present method, the first and second elongated flexible magnetic control body 50 sections are sections of a curved turnaround region TA, and the method involves independently adjusting the first and second elongated flexible magnetic control body 50 sections such that one of them is positioned a different distance from the adjacent rear surface 91 of the sputtering target 90 than the other of them.

In some embodiments, the method involves both: i) independently adjusting (e.g., bending or otherwise deforming) one or more elongated flexible magnetic control bodies 50 located on a turnaround lane TA of the plasma racetrack RT, and ii) independently adjusting one or more elongated flexible magnetic control body 50 sections located on an elongated side region SR of the plasma racetrack.

The independent movement of one or more elongated flexible magnetic control body 50 sections preferably is initiated by operating a control unit 10 that actuates a plurality of motors 20 to drive the independent movements. As described previously, the motors 20 in some cases rotate a plurality of fasteners 30. When provided, the fasteners 30 may move axially when they are rotated by the motors 20. In other cases, motors may be provided that simply move respective drive members axially (i.e., without rotating them). The control unit 10 preferably is located at a position external to the sputtering chamber 200, such that an operator initiates the independent movement from outside the sputtering chamber without opening the sputtering chamber (e.g., while maintaining a vacuum inside the chamber).

Any method of the present disclosure can optionally involve operating the sputter deposition assembly 100 so as to deposit a film on a substrate (e.g., a glass substrate) S. In some embodiments, the film is deposited at a thickness of less than 3,000 angstroms. In one example, the film includes both indium and tin and is deposited at a thickness of between 200 and 2,000 angstroms. In other embodiments, the film includes silver and is deposited at a thickness of between 50 and 300 angstroms.

While some preferred embodiments of the invention have been described, it should be understood that various changes, adaptations and modifications may be made therein without departing from the spirit of the invention and the scope of the appended claims.

What is claimed is:

1. A sputter deposition assembly comprising a sputtering chamber, a sputtering target, and a magnet assembly, the magnet assembly being mounted adjacent to a rear surface of the sputtering target, the magnet assembly comprising a magnetic backing plate and spaced-apart first and second permanent magnets, the first and second permanent magnets each having a proximal end and a distal end, the distal end being further from the sputtering target than is the proximal end, the magnet assembly creating a magnetic field comprising field lines that extend from the proximal end of the first permanent magnet, through the sputtering target, along an arc located in front of the sputtering target, back through the sputtering target, into the proximal end of the second permanent magnet, through the second permanent magnet, along a return path, and to the distal end of the first permanent magnet, the return path passing through the magnetic backing plate of the magnet assembly, the magnetic backing plate defining a gap, the magnet assembly further comprising an elongated flexible magnetic control body mounted so as to project into the gap, the elongated flexible magnetic control body having a length and being differentially bendable along the length so as to project further into the gap at one position along the length than at another position along the length.

2. The sputter deposition assembly of claim 1 wherein the sputter deposition assembly is configured such that the arc of the magnetic field lines located in front of the sputtering target changes in strength, configuration, or both in response to bending the elongated flexible magnetic control body so that the elongated flexible magnetic control body projects to a greater or lesser extent into the gap at one or more desired positions along the length.

3. The sputter deposition assembly of claim 1 wherein the magnetic backing plate comprises two plate segments having confronting ends that bound the gap, the elongated flexible magnetic control body having two generally opposed engagement faces, the elongated flexible magnetic control body being differentially bendable such that an extent to which it projects into the gap at different points along the length is locally adjustable between first and second configurations, the first configuration characterized by the two engagement faces of the elongated flexible magnetic control body contacting the confronting ends of the two plate segments, the second configuration characterized by the two engagement faces of the elongated flexible magnetic control body being spaced apart from the confronting ends of the two plate segments.

4. The sputter deposition assembly of claim 1 wherein the elongated flexible magnetic control body is constructed to bend differentially along the length so as to define a continuous profile devoid of step-like transitions along the length of the elongated flexible magnetic control body.

5. The sputter deposition assembly of claim 1 wherein the elongated flexible magnetic control body comprises a ferromagnetic fluid contained within a bendable wall.

6. The sputter deposition assembly of claim 5 wherein the ferromagnetic fluid comprises both oil and steel particles.

7. The sputter deposition assembly of claim 1 wherein the magnet assembly is configured in a racetrack arrangement that includes: (i) two generally parallel elongated side regions, and (ii) two curved turnaround regions at opposite ends of the racetrack arrangement, each curved turnaround region having a length, the elongated flexible magnetic control body spanning at least a portion of the length of one of the two curved turnaround regions such that the length of the elongated flexible magnetic control body extends along a curved path.

8. The sputter deposition assembly of claim 7 wherein the elongated flexible magnetic control body spans at least substantially the entire length of one of the two curved turnaround regions.

9. The sputter deposition assembly of claim 1 wherein the magnet assembly further includes an actuator system comprising a series of adjustments spaced apart along the length, the adjustments configured such that the elongated flexible magnetic control body bends locally, so as to project different extents into the gap at different points along the length, in response to operation of one or more of the adjustments.

10. The sputter deposition assembly of claim 9 wherein each of the adjustments is coupled to a motor configured to move such adjustment selectively toward or away from the sputtering target, the sputter deposition assembly further comprising a control unit connected with each said motor to control movement of the adjustments, the control unit being located at a position external to the sputtering chamber, whereby movement of the adjustments is configured to be initiated by an operator from outside the sputtering chamber without having to open the sputtering chamber.

11. A sputter deposition assembly comprising a sputtering chamber, a sputtering target, and a magnet assembly, the magnet assembly being mounted adjacent to a rear surface of the sputtering target, the magnet assembly comprising a magnetic backing plate and spaced-apart first and second permanent magnets, the first and second permanent magnets each having a proximal end and a distal end, the distal end being further from the sputtering target than is the proximal end, the magnet assembly creating a magnetic field comprising field lines that extend from the proximal end of the first permanent magnet, through the sputtering target, along an arc located in front of the sputtering target, back through the sputtering target, into the proximal end of the second permanent magnet, through the second permanent magnet, along a return path, and to the distal end of the first permanent magnet, the return path passing through the magnetic backing plate of the magnet assembly, the magnetic backing plate comprising a plurality of layered metal sheets each formed of ferromagnetic or ferrimagnetic material.

12. The sputter deposition assembly of claim 11 wherein the layered metal sheets are carried alongside one another in a layered arrangement having opposed first and second sides, the layered arrangement characterized by the layered metal sheets being locked in permanent contact with one another at the first side whereas at the second side the layered arrangement is expandable such that at least one of the layered metal sheets is configured to bend away from at least another of the layered metal sheets in response to operation of an actuator.

13. The sputter deposition assembly of claim 11 wherein the plurality of layered metal sheets comprises first and second metal sheets each having opposed first and second faces, the first face of the first metal sheet being in contact with both the distal end of the first permanent magnet and the distal end of the second permanent magnet, the second metal sheet having opposed first and second faces, the second metal sheet being separated from the first and second permanent magnets by at least the first metal sheet.

14. The sputter deposition assembly of claim 13 wherein the second metal sheet is a flexible metal leaf.

15. The sputter deposition assembly of claim 14 wherein the sputter deposition assembly is configured such that the arc of the magnetic field lines located in front of the sputtering target changes in strength, configuration, or both in response to bending of the second metal sheet away from the first metal sheet.

16. The sputter deposition assembly of claim 13 wherein the layered metal sheets extend from a first side adjacent the first permanent magnet to a second side adjacent the second permanent magnet.

17. The sputter deposition assembly of claim 16 wherein the layered metal sheets are carried alongside one another in a layered arrangement characterized by the layered metal sheets being locked in permanent contact with one another at the first side whereas at the second side the layered arrangement is expandable such that at least the second metal sheet is configured to bend away from the first metal sheet in response to operation of an actuator.

18. The sputter deposition assembly of claim 17 wherein the layered arrangement at the second side is adjustable between first and second configurations, the first configuration being a compact configuration characterized by the layered metal sheets being in contact with one another at the second side, the second configuration being an expanded configuration characterized by the layered metal sheets being spaced apart from one another at the second side, the sputter deposition assembly being configured such that the arc of the magnetic field lines located in front of the sputtering target changes in strength, configuration, or both in response to adjustment of the layered arrangement at the second side between the first and second configurations.

19. The sputter deposition assembly of claim 17 wherein the plurality of layered metal sheets comprises first, second, and third metal sheets, the first configuration being a compact configuration characterized by the first metal sheet being in contact with the second metal sheet at the second side while the second metal sheet is in contact with the third metal sheet at the second side, the second configuration being an expanded configuration characterized by the first metal sheet being spaced apart from the second metal sheet at the second side while the second metal sheet is spaced apart from the third metal sheet at the second side.

20. The sputter deposition assembly of claim 17 wherein the actuator comprises a threaded shaft extending through all of the layered metal sheets, the threaded shaft being coupled to a motor configured to rotate such threaded shaft, the sputter deposition assembly further comprising a control unit connected with the motor to control rotation of the threaded shaft, the control unit being located at a position external to the sputtering chamber, whereby bending of at least one of the layered metal sheets is configured to be initiated by an operator from outside the sputtering chamber without having to open the sputtering chamber.

21. A sputter deposition assembly comprising a sputtering chamber, a sputtering target, and a magnet assembly, the magnet assembly being mounted adjacent to a rear surface of the sputtering target, the magnet assembly comprising a magnetic backing plate and spaced-apart first and second permanent magnets, the first and second permanent magnets each having a proximal end and a distal end, the distal end being further from the sputtering target than is the proximal end, the magnet assembly creating a magnetic field comprising field lines that extend from the proximal end of the first permanent magnet, through the sputtering target, along an arc located in front of the sputtering target, back through the sputtering target, into the proximal end of the second permanent magnet, through the second permanent magnet, along a return path, and to the distal end of the first permanent magnet, the return path passing through the magnetic backing plate of the magnet assembly, the magnetic backing plate comprising a plurality of layered metal sheets each formed of ferromagnetic or ferrimagnetic material, at least one of the layered metal sheets being a bendable metal sheet configured to bend away from the sputtering target.

* * * * *